US012725578B2

(12) United States Patent
Park

(10) Patent No.: US 12,725,578 B2
(45) Date of Patent: Sep. 1, 2026

(54) GATE DRIVING CIRCUIT AND TRANSPARENT DISPLAY APPARATUS COMPRISING THE SAME

(71) Applicant: LG Display Co., Ltd., Seoul (KR)

(72) Inventor: Sunghee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/941,945

(22) Filed: Nov. 8, 2024

(65) Prior Publication Data

US 2025/0246149 A1 Jul. 31, 2025

(30) Foreign Application Priority Data

Jan. 30, 2024 (KR) ........................ 10-2024-0014070

(51) Int. Cl.

*G09G 3/32* (2016.01)
*G09G 3/3233* (2016.01)
*G09G 3/3266* (2016.01)
*H10K 59/121* (2023.01)
*H10K 59/80* (2023.01)

(52) U.S. Cl.

CPC ......... *G09G 3/3266* (2013.01); *G09G 3/3233* (2013.01); *H10K 59/1213* (2023.02); *H10K 59/873* (2023.02); *G09G 2300/0842* (2013.01); *G09G 2310/0286* (2013.01)

(58) Field of Classification Search

CPC ............... G09G 3/3266; G09G 3/3233; G09G 2300/0842; G09G 2310/0286; G09G 3/20; G09G 2310/0243; G09G 2310/0264; G09G 2310/067; G09G 2300/0408; G09G 2310/0267; H10K 59/1213; H10K 59/873

See application file for complete search history.

(56) References Cited

U.S. PATENT DOCUMENTS

2011/0316831 A1* 12/2011 Ochiai ................ G09G 3/3688 345/208
2013/0278580 A1 10/2013 Mok et al.
2018/0157373 A1* 6/2018 Tu ........................ G09G 3/2092
2018/0321539 A1* 11/2018 Koide ................. G06F 3/04164
2019/0103067 A1* 4/2019 Kim ..................... G09G 3/3696
2020/0006702 A1 1/2020 Sonoda et al.
2021/0327359 A1* 10/2021 Li ........................ G09G 3/3266
2023/0033385 A1* 2/2023 Park ...................... G06F 3/0443

(Continued)

FOREIGN PATENT DOCUMENTS

CN 106297639 A 1/2017
KR 20230041221 A 3/2023

*Primary Examiner* — Pegeman Karimi

(74) *Attorney, Agent, or Firm* — Seed Intellectual Property Law Group LLP

(57) ABSTRACT

A gate driving circuit according to one or more embodiments of the present disclosure is described. The gate driving circuit may include a plurality of stage circuits connected to be cascaded to each other along a first direction, outputting a plurality of output signals. Each stage circuit of the plurality of stage circuits may include a circuit area and a dummy area. The circuit area is an area in which a circuit portion including at least one thin film transistor for controlling the output of the plurality of output signals is disposed. The dummy area is an area in which an undercut line extended in a second direction crossing the first direction is disposed.

35 Claims, 19 Drawing Sheets

(56) References Cited

U.S. PATENT DOCUMENTS

| | | | |
|---|---|---|---|
| 2023/0092438 | A1 | 3/2023 | Park et al. |
| 2023/0215378 | A1 | 7/2023 | Choi et al. |
| 2024/0029611 | A1 | 1/2024 | Kim et al. |

* cited by examiner

FIG. 5

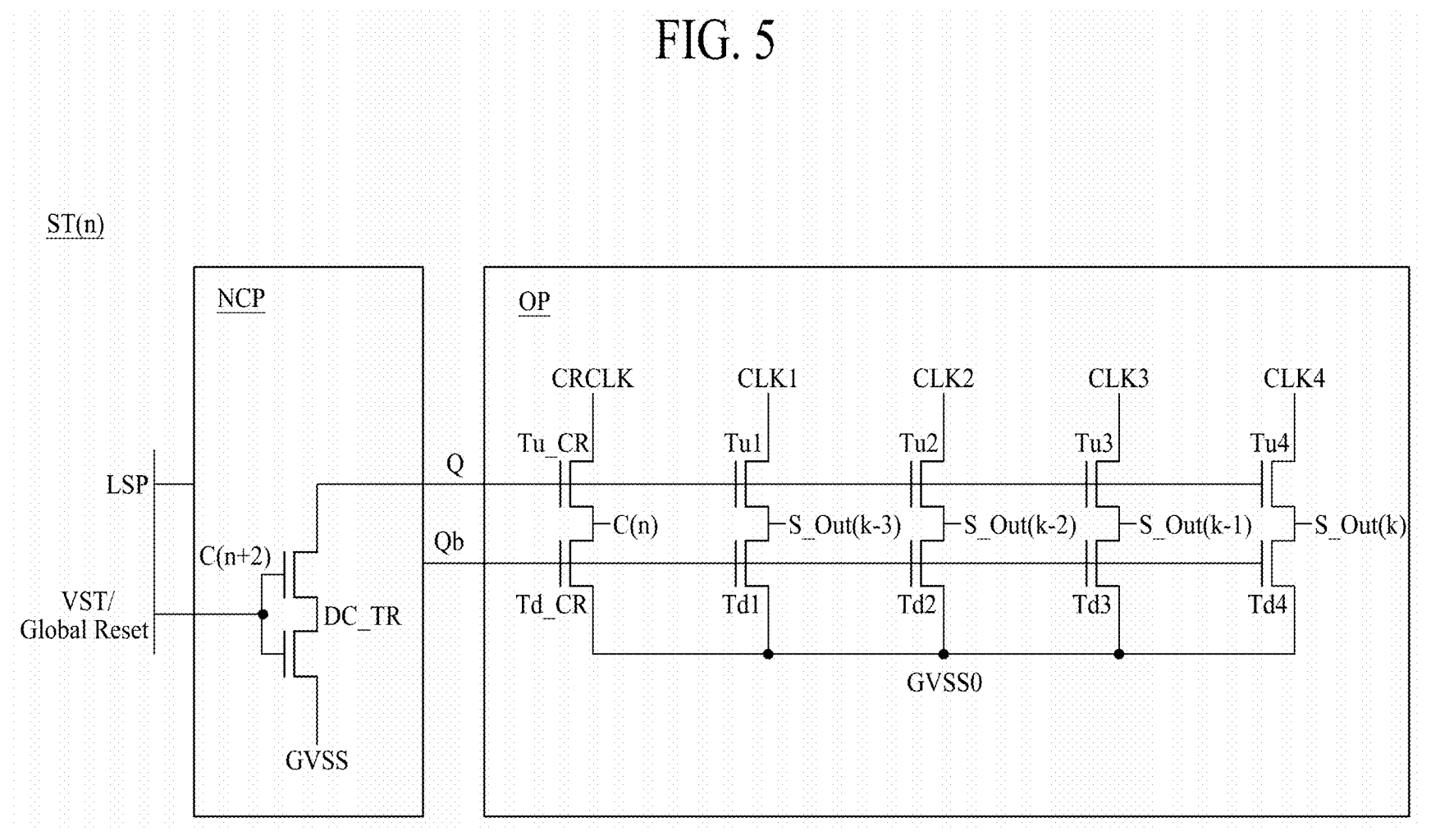

ST(n)
LSP
VST/
Global Reset
NCP
C(n+2)
DC_TR
GVSS
Q
Qb
OP
CRCLK
Tu_CR
C(n)
Td_CR
CLK1
Tu1
S_Out(k-3)
Td1
CLK2
Tu2
S_Out(k-2)
Td2
GVSS0
CLK3
Tu3
S_Out(k-1)
Td3
CLK4
Tu4
S_Out(k)
Td4

FIG. 6

II-II'
BA
PLN
PAS2
PAS1
ILD
BF
111
OL4(n)
OL2(n)
OL3(n)
OL1(n)
OL3(n-1)
OL4(n-1)
OL2(n-1)
OL1(n-1)
OL1(n-1)
OL3(n-1)
OL2(n-1)
OL4(n-1)
OL1(n)
OL2(n)
OL4(n)
OL3(n)
Z
X
Y

FIG. 13
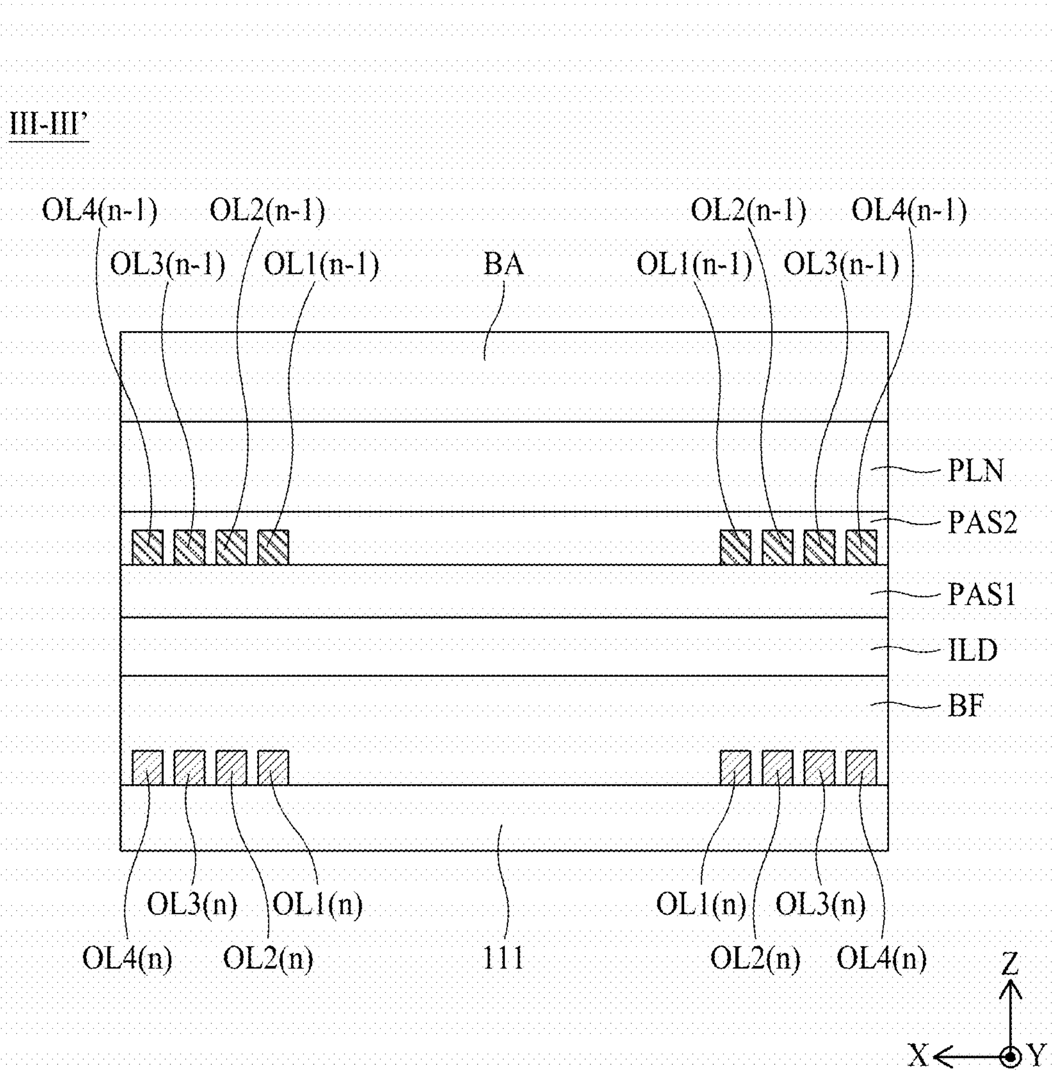

GATE DRIVING CIRCUIT AND TRANSPARENT DISPLAY APPARATUS COMPRISING THE SAME

CROSS-REFERENCE TO RELATED APPLICATIONS

This application claims priority to Korean Patent Application No. 10-2024-0014070 filed in the Republic of Korea on Jan. 30, 2024, the entire contents of which is hereby expressly incorporated by reference into the present application.

BACKGROUND

Technical Field

The present disclosure relates to a gate driving circuit and a transparent display apparatus comprising the same.

Description of the Related Art

With the advancement of the information age, the demand for a display apparatus for displaying an image has increased in various forms. Therefore, various types of display apparatuses such as a liquid crystal display (LCD) apparatus, an organic light emitting display (OLED) apparatus, a micro light emitting diode (LED) display apparatus and a quantum dot display (QD) apparatus have been recently used.

These display apparatuses include a display panel that includes a plurality of pixels having a thin film transistor connected to a plurality of gate lines and a plurality of data lines to display an image, a data driving circuit that supplies a data voltage to the data line, and a gate driving circuit with a shift register having a plurality of stages to supply a gate signal to the gate line.

The gate driving circuit may be formed in a non-display area of a display panel in a process of manufacturing the data lines and gate lines of the display panel and the thin film transistor of each pixel. That is, the gate driving circuit is integrated in the display panel in a gate in panel (GIP) method.

Recently, studies for a transparent display apparatus that displays an image for a user and allows the user to view objects or images, which are positioned at an opposite side thereof, by transmitting light are actively ongoing. The transparent display apparatus includes a display area, on which an image is displayed, and a non-display area, wherein the display area may include a transmissive area capable of transmitting external light and a non-transmissive area. The transparent display apparatus may have high light transmittance in the display area through the transmissive area.

BRIEF SUMMARY

A transparent display apparatus is highly likely to be used in various fields in situations where a user views images and backgrounds together. However, since the transparent display apparatus may be applied to various fields and used for various purposes of use, it is beneficial to manufacture these in multiple types or various sizes. However, the inventors of the present disclosure have appreciated that when the transparent display apparatus is manufactured in multiple types or various sizes, technical problems occur in that manufacturing cost and production energy are increased due to an increase in the number of processes. Various embodiments of the present disclosure address the technical problems in the related art, including the problem identified above.

An aspect of the present disclosure is directed to providing a gate driving circuit having a low area structure by reducing thin film transistors and signal lines, which constitute a stage circuit, and a transparent display apparatus comprising the same.

Another aspect of the present disclosure is directed to providing a gate driving circuit capable of preventing an abnormal operation by a dummy stage circuit, and a transparent display apparatus comprising the same.

Another aspect of the present disclosure is directed to providing a gate driving circuit, which may be manufactured in multiple types (or various sizes), and a transparent display apparatus comprising the same.

The technical benefits of the present disclosure are not limited to the aforesaid, but other benefits not described herein will be clearly understood by those skilled in the art from descriptions below.

A gate driving circuit according to an embodiment of the present disclosure may include a plurality of stage circuits connected to be cascaded to each other along a first direction, outputting a plurality of output signals, wherein each of the stage circuits may include a circuit area in which a circuit portion including at least one thin film transistor for controlling the output of the plurality of output signals is disposed, and a dummy area in which an undercut line extended in a second direction crossing the first direction is disposed.

A transparent display apparatus according to an embodiment of the present disclosure may include a display panel including a display area and a non-display area around the display area, the display area including a transmissive area and a non-transmissive area, and a gate driving circuit disposed in the non-display area of the display panel, wherein the gate driving circuit includes a plurality of stage circuits connected to be cascaded to each other along a first direction, outputting a plurality of output signals, wherein each of the stage circuits may include a circuit area in which a circuit portion including at least one thin film transistor for controlling the output of the plurality of output signals is disposed, and a dummy area in which an undercut line extended in a second direction crossing the first direction is disposed, and the undercut line disposed in the dummy area of each of the plurality of stage circuits may be extended to the display area and the non-display area of the display panel.

According to the embodiment of the present disclosure, the gate driving circuit having a low area structure by reducing thin film transistors and signal lines, which constitute the stage circuit, and the transparent display apparatus comprising the same may be provided.

According to the embodiment of the present disclosure, the gate driving circuit capable of preventing the abnormal operation by the dummy stage circuit, and the transparent display apparatus comprising the same may be provided.

According to the embodiment of the present disclosure, the gate driving circuit, which may be manufactured in multiple types (or various sizes), and the transparent display apparatus comprising the same may be provided.

In the gate driving circuit and the transparent display apparatus comprising the same according to the embodiment of the present disclosure, as the transparent display panel manufactured in a large area may be manufactured in multiple types (or various sizes) by a cutting process, a manufacturing process for producing multiple types of transparent display apparatus may be reduced, whereby greenhouse gas that may occur due to the manufacturing process may be reduced, and thus Environment/Social/Governance (ESG) may be implemented.

The effects of the present disclosure are not limited to the aforesaid, but other effects not described herein will be clearly understood by those skilled in the art from descriptions below.

The details of the present disclosure described in technical problem, technical solution, and advantageous effects do not specify essential features of claims, and thus, the scope of claims is not limited by the details described in detailed description of the disclosure.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain principles of the disclosure.

FIG. 5 is a view illustrating a stage circuit according to the embodiment of the present disclosure.

FIG. 6 is a view illustrating a layout of a stage circuit according to another embodiment of the present disclosure.

FIG. 13 is a cross-sectional view taken along line III-III' shown in FIG. 11 according to another embodiment of the present disclosure.

Figure 1:
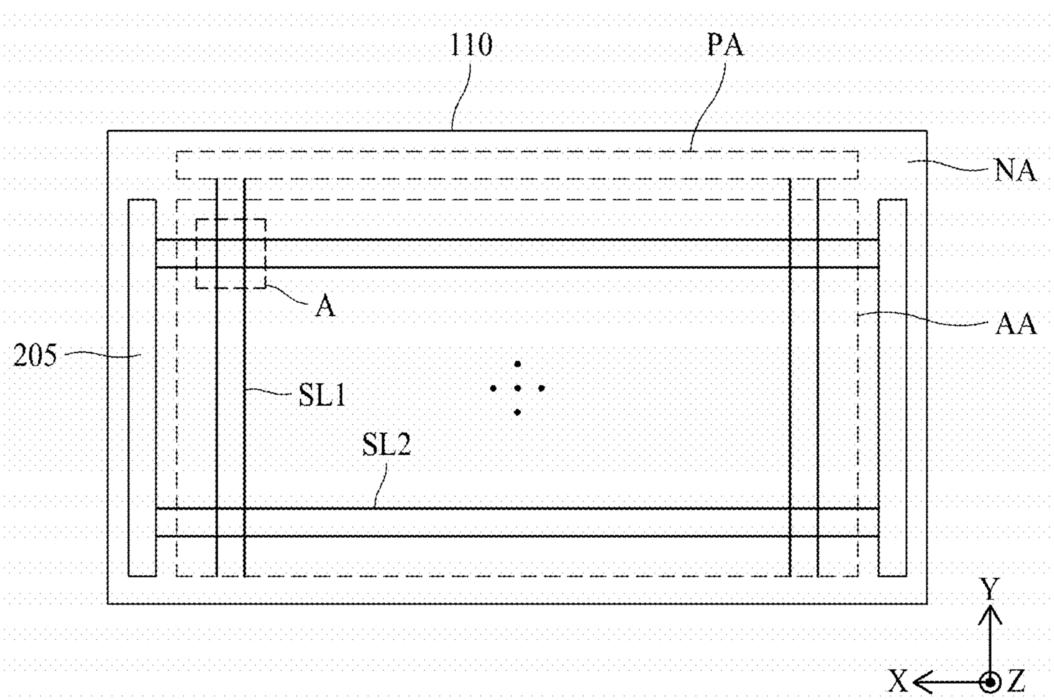
FIG. 1 is a view illustrating a transparent display apparatus according to the embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction of thereof may be exaggerated for clarity, illustration, and/or convenience.

DETAILED DESCRIPTION

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete, to assist those skilled in the art to understand the inventive concepts without limiting the protected scope of the present disclosure.

Shapes (e.g., sizes, lengths, widths, heights, thicknesses, locations, radii, diameters, and areas), sizes, ratios, angles, numbers, and the like disclosed herein, including those illustrated in the drawings are merely examples, and thus, the present disclosure is not limited to the illustrated details. Any implementation described herein as an “example” is not necessarily to be construed as preferred or advantageous over other implementations. It is, however, noted that the relative dimensions of the components illustrated in the drawings are part of the present disclosure.

When the term “comprise,” “have,” “include,” “contain,” “constitute,” “made of,” “formed of,” or the like is used with respect to one or more elements, one or more other elements may be added unless a term such as “only” or the like is used. The terms used in the present disclosure are merely used in order to describe example embodiments, and are not intended to limit the scope of the present disclosure. The terms of a singular form may include plural forms unless the context clearly indicates otherwise.

In construing an element, the element is construed as including an error region although there is no explicit description thereof.

In describing a positional relationship, for example, when the positional order is described as “on,” “above,” “below,” “beneath,” and “next,” the case of no contact therebetween may be included, unless “just” or “direct” is used.

If it is mentioned that a first element is positioned “on” a second element, it does not mean that the first element is essentially positioned above the second element in the figure. The upper part and the lower part of an object concerned may be changed depending on the orientation of the object. Consequently, the case in which a first element is positioned “on” a second element includes the case in which the first element is positioned “below” the second element as well as the case in which the first element is positioned “above” the second element in the figure or in an actual configuration.

In describing a temporal relationship, for example, when the temporal order is described as “after,” “subsequent,” “next,” and “before,” a case which is not continuous may be included, unless “just” or “direct” is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element is "connected," "coupled," "attached," "adhered," or the like to another element, the element may not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element is "contacts," "overlaps," or the like with another element, the element may not only directly contact, overlap, or the like with another element, but also indirectly contact, overlap, or the like with another element with one or more intervening elements disposed or interposed between the elements, unless otherwise specified.

The term "at least one" should be understood as including any and all combinations of one or more of the associated listed items. For example, "at least one among a first element, a second element and a third element" may include all combinations of two or more elements selected from the first, second and third elements as well as each element of the first, second and third elements.

Features of various embodiments of the present disclosure may be partially or entirety coupled to or combined with each other, may be technically associated with each other, and may be variously inter-operated, linked or driven together. The embodiments of the present disclosure may be implemented or carried out independently of each other, or may be implemented or carried out together in a co-dependent or related relationship. In one or more aspects, the components of each apparatus according to various embodiments of the present disclosure are operatively coupled and configured.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

Figure 2:
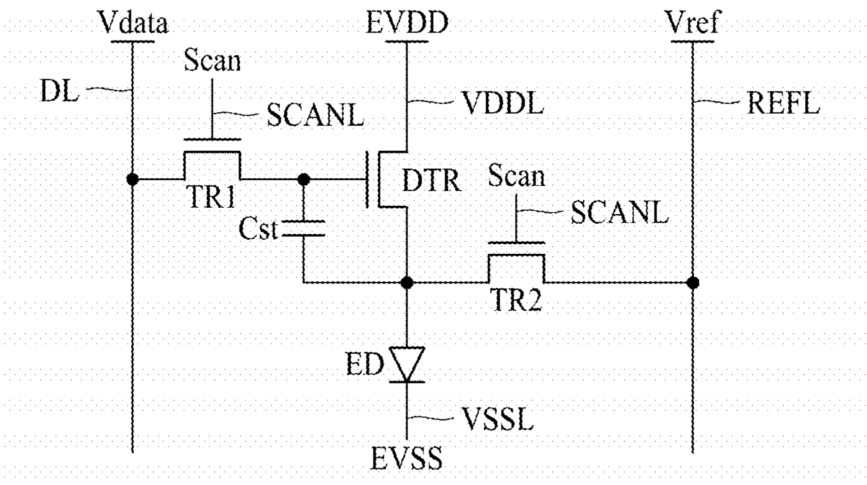
FIG. 2 is a circuit view illustrating a subpixel of a transparent display apparatus according to the embodiment of the present disclosure.

FIG. 1 is a view illustrating a transparent display apparatus according to the embodiment of the present disclosure. FIG. 2 is a circuit view illustrating a subpixel of a transparent display apparatus according to the embodiment of the present disclosure.

Hereinafter, X-axis represents a direction parallel with a scan line, Y-axis represents a direction parallel with a data line, and Z-axis represents a height direction of the transparent display apparatus.

Although the transparent display apparatus according to one embodiment of the present disclosure will be described to be implemented as an organic light emitting display (OLED), it may be also implemented as a liquid crystal display (LCD), a micro LED display, a quantum dot display (QD), etc.

Referring to FIGS. 1 and 2, the transparent display apparatus according to one embodiment of the present disclosure may include a transparent display panel 110 that includes a display area AA in which pixels are provided to display an image and a non-display area NA around the display area AA in which an image is not displayed.

The display area AA of the transparent display panel 110 may include first signal lines SL1, second signal lines SL2 and pixels, and the non-display area NA thereof may include a pad area PA in which pads are disposed and at least one gate driver 205.

The first signal lines SL1 may be extended in a first direction (or Y-axis direction), and may cross the second signal lines SL2 in the display area AA. The second signal lines SL2 may be extended in a second direction (or X-axis direction). The pixels may be disposed in an area where the first signal line SL1 and the second signal line SL2 cross each other, and may emit predetermined light to display an image.

The gate driver 205 may be connected to a scan line to supply a scan signal. The gate driver 205 may be implemented in the non-display area NA outside one side or both sides of the display area AA of the transparent display panel 110 in a gate driver in panel (GIP) method or a tape automated bonding (TAB) method.

A source drive integrated circuit, a circuit board or a timing controller, which is connected through a flexible circuit film, may be electrically connected to the pad area PA of the transparent display panel 110.

Referring to FIG. 2, each of the pixels includes a plurality of subpixels constituting a unit pixel, and each of the subpixels includes a circuit element having a 3T1C structure (three transistors and one capacitor) that includes a first switching transistor TR1, a second switching transistor TR2, a driving transistor DTR, and a capacitor Cst, and a light emitting element ED, but is not limited thereto. Each subpixel may further include a compensation circuit, and in this case, may have various structures such as 4T2C, 5T2C, 6T1C, 6T2C, 7T1C and 7T2C.

Each of the transistors DTR, TR1 and TR2 of each subpixel may include a gate electrode, a source electrode and a drain electrode. Since the source electrode and the drain electrode are not fixed and may be changed depending on a current direction and a voltage applied to the gate electrode, one of the source electrode and the drain electrode may be expressed as a first electrode and the other one may be expressed as a second electrode. The transistors DTR, TR1 and TR2 of each subpixel may use at least one of a polysilicon semiconductor, an amorphous silicon semiconductor and an oxide semiconductor. The transistors DTR, TR1 and TR2 may be P-type or N-type transistors, or P-type and N-type transistors may be used interchangeably.

The first switching transistor TR1 may serve to supply a data voltage Vdata supplied from a data line DL to the driving transistor DTR. For example, the first switching transistor TR1 may charge the capacitor Cst with the data voltage Vdata supplied from the data line DL. To this end, the gate electrode of the first switching transistor TR1 may be connected to a scan line SCANL (or a gate line), and a first electrode thereof may be connected to the data line DL. Also, a second electrode of the first switching transistor TR1 may be connected to one end of the capacitor Cst and the gate electrode of the driving transistor DTR.

The first switching transistor TR1 may be turned on in response to a scan signal Scan applied through the scan line SCANL (or the gate line). When the first switching transistor TR1 is turned on, the data voltage Vdata applied through the data line DL may be transferred to one end of the capacitor Cst.

The second switching transistor TR2 may serve to supply a reference voltage Vref supplied from a reference line REFL to the driving transistor DTR. For example, the gate electrode of the second switching transistor TR2 may be connected to the scan line SCANL (or the gate line), and a first electrode thereof may be connected to the reference line REFL. Also, the second electrode of the second switching transistor TR2 may be connected to a second electrode of the driving transistor DTR and the other end of the capacitor Cst.

The second switching transistor TR2 may be turned on in response to the scan signal Scan applied through the scan line SCANL (or the gate line). When the second switching transistor TR2 is turned on, the reference voltage Vref applied through the reference line REFL may be transferred to the other end of the capacitor Cst. Also, the reference voltage Vref may be applied to the second electrode, for example, source electrode of the driving transistor DTR.

The capacitor Cst may serve to maintain the data voltage Vdata supplied to the driving transistor DTR for one frame. For example, a first electrode of the capacitor Cst may be connected to the gate electrode of the driving transistor DTR, and a second electrode thereof may be connected to the source electrode of the driving transistor DTR. The capacitor Cst may store a voltage corresponding to the data voltage Vdata transferred through the first switching transistor TR1, and may turn on the driving transistor DTR with the stored voltage.

The driving transistor DTR may generate a data current from a first power source EVDD supplied from a pixel power source line VDDL (or a first power source line) to supply the generated data current to an anode electrode of the light emitting element ED. For example, the gate electrode of the driving transistor DTR may be connected to one end of the capacitor Cst, and the first electrode thereof may be connected to the pixel power source line VDDL. Also, a second electrode of the driving transistor DTR may be connected to the anode electrode of the light emitting element ED.

The light emitting element ED may include an anode electrode connected to the driving transistor DTR, a cathode electrode receiving a second power source EVSS from a common power line VSSL (or a second power line), and a light emitting layer between the anode electrode and the cathode electrode. The anode electrode is an independent electrode for each light emitting element, but the cathode electrode may be a common electrode shared by the entire light emitting elements. When a driving current is supplied from the driving transistor DTR, electrons from the cathode electrode may be injected into the light emitting layer and holes from the anode electrode may be injected into the light emitting layer, so that the light emitting element ED may allow fluorescent or phosphorescent materials to emit light through recombination of the electrons and the holes in the light emitting layer, thereby generating light of brightness proportional to a current value of the driving current.

The anode electrode of the light emitting element ED may be connected to the second electrode of the driving transistor DTR, and the cathode electrode thereof may be connected to the common power line VSSL. The light emitting element ED may emit light in response to the driving current generated by the driving transistor DTR.

Figure 3:
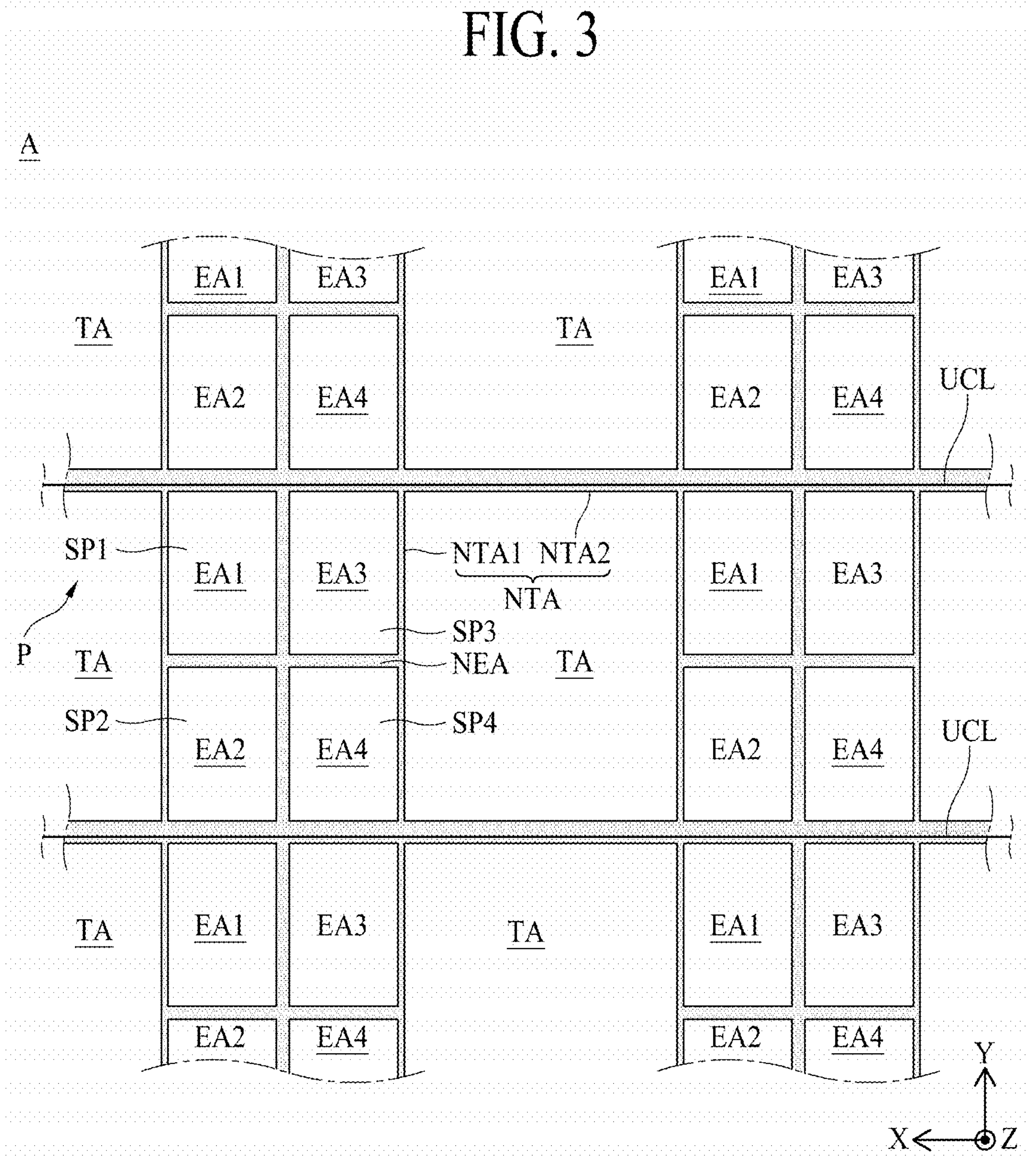
FIG. 3 is a view illustrating an area A shown in FIG. 1 according to the embodiment of the present disclosure.

FIG. 3 is a view illustrating an area A shown in FIG. 1 according to the embodiment of the present disclosure.

Referring to FIG. 3 in conjunction with FIGS. 1 and 2, the transparent display panel 110 according to the embodiment of the present disclosure may include a display area AA and a non-display area NA. The display area AA may include a transmissive area TA and a non-transmissive area NTA. The transmissive area TA may be an area that transmits most of light incident from the outside, and the non-transmissive area NTA may be an area that does not transmit most of light incident from the outside. For example, the transmissive area TA may be an area having light transmittance greater than α%, and the non-transmissive area NTA may be an area having light transmittance smaller than β%. In this case, α may be a value greater than β. A user may see an object or a background, which is positioned on a back surface (or a rear surface) of the transparent display panel 110, due to the transmissive areas TA of the transparent display panel 110.

The non-transmissive area NTA may include a first non-transmissive area NTA1, a second non-transmissive area NTA2 and pixels P.

The first non-transmissive area NTA1 is extended from the display area AA in the first direction (or Y-axis direction), and may be disposed to overlap at least a portion of light emission areas EA1, EA2, EA3 and EA4. A plurality of first non-transmissive areas NTA1 may be configured. The plurality of first non-transmissive areas NTA1 may be extended in the first direction (or Y-axis direction), and may be disposed to be spaced apart from each other in the second direction (or X-axis direction). Two adjacent first non-transmissive areas NTA1 may be disposed to be spaced apart from each other with the transmissive area TA interposed therebetween. For example, the transmissive area TA may be disposed between the two adjacent first non-transmissive areas NTA1. The first signal lines SL1 extended in the first direction (or Y-axis direction) may be disposed in the first non-transmissive area NTA1. For example, the first signal lines SL1 may be disposed to overlap the first non-transmissive area NTA1.

The first signal lines SL1 may include at least one of the pixel power line VDDL (or the first power line), the common power line VSSL (or the second power line), the reference line REFL and the data lines DL. For example, the first signal lines SL1 may further include a touch sensor line, but the embodiments of the present disclosure are not limited thereto.

The pixel power line VDDL (or the first power line) may supply the first power source EVDD to the driving transistor DTR of each of subpixels SP1, SP2, SP3 and SP4 provided in the display area AA.

The common power line VSSL (or the second power line) may supply the second power source EVSS to the cathode electrode of the subpixels SP1, SP2, SP3 and SP4 provided in the display area AA. In this case, the second power source EVSS may be a common power source supplied in common to the subpixels SP1, SP2, SP3 and SP4.

The reference line REFL may supply an initialization voltage (or a reference voltage) to the driving transistor DTR of each of the subpixels SP1, SP2, SP3 and SP4 provided in the display area AA. For example, the reference line REFL may be disposed between the plurality of data lines DL. For example, the reference line REFL may be disposed in the middle of the plurality of data lines DL.

Each of the data lines DL may supply the data voltage Vdata to the subpixels SP1, SP2, SP3 and SP4. For example, each of the data lines DL may supply a first data voltage to a first driving transistor of the first subpixel SP1, may supply a second data voltage to a second driving transistor of the second subpixel SP2, may supply a third data voltage to a third driving transistor of the third subpixel SP3, and may supply a fourth data voltage to a fourth driving transistor of the fourth subpixel SP4.

The second non-transmissive area NTA2 may be extended from the display area AA in the second direction (or X-axis direction), and may be disposed to overlap at least a portion of the light emission areas EA1, EA2, EA3 and EA4. For example, the second non-transmissive area NTA2 may be extended in the second direction (or X-axis direction) between two adjacent first non-transmissive areas NTA1. A plurality of second non-transmissive areas NTA2 may be configured. The plurality of second non-transmissive areas NTA2 may be extended in the second direction (or X-side direction), and may be disposed to be spaced apart from each other in the first direction (or Y-axis direction). The two adjacent second non-transmissive areas NTA2 may be disposed to be spaced apart from each other with the transmissive area TA interposed therebetween. For example, the transmissive area TA may be disposed between two adjacent second non-transmissive areas NTA2. The second signal lines SL2 extended in the second direction (or X-axis direction) may be disposed in the second non-transmissive area NTA2. For example, the second signal lines SL2 may be disposed to overlap the second non-transmissive area NTA2.

The second signal lines SL2 may be extended in the second direction (or X-axis direction), and may include the scan line SCANL (or the gate line). The scan line SCANL may supply the scan signal to the subpixels SP1, SP2, SP3 and SP4 of the pixel P.

The scan line SCANL may be connected to each of the pixels P corresponding to an adjacent horizontal line. For example, the horizontal line may mean that the plurality of pixels P are disposed in parallel along the second direction (or X-axis direction). For example, the scan line SCANL may be connected to the pixels P corresponding to an upper horizontal line among two adjacent horizontal lines. For example, the upper horizontal line may be a horizontal line corresponding to the pixels P positioned at an upper side based on the pixel P shown in FIG. 3. For example, the scan line SCANL (or the gate line) may be disposed to be adjacent to the first subpixel SP1 and the third subpixel SP3. Also, the scan line SCANL may be connected to the pixels P corresponding to a lower horizontal line of the two adjacent horizontal lines. For example, the lower horizontal line may be a horizontal line corresponding to the pixels P positioned at a lower side with respect to the pixel P shown in FIG. 3. For example, the scan line SCANL (or the gate line) may be disposed to be adjacent to the second subpixel SP2 and the fourth subpixel SP4, but the embodiments of the present disclosure are not limited thereto. For example, the scan lines SCANL may provide different scan signals to the pixels P corresponding to one horizontal line. For example, different scan signals may be provided to the pixels P corresponding to a horizontal line with respect to the pixel P shown in FIG. 3.

The pixels P may be disposed in each crossing area where the first non-transmissive area NTA1 and the second non-transmissive area NTA2 cross each other, and may emit light to display an image. Each of the pixels P is disposed between adjacent transmissive areas TA, and the pixel P may include light emission areas EA1, EA2, EA3 and EA4 in which a light emitting element is disposed to emit light and non-emission areas NEA. The light emission areas EA1, EA2, EA3 and EA4 may correspond to areas, which emit light, in the pixel P. Since an area of the non-transmissive area NTA is small in the transparent display panel 110, the circuit element may be disposed to overlap the light emission areas EA1, EA2, EA3 and EA4. For example, the light emission areas EA1, EA2, EA3 and EA4 may at least partially overlap circuit areas in which the circuit element is disposed.

Each of the pixels P is provided in the first non-transmissive area NTA1, and may emit light to display an image. Each of the pixels P may include a first subpixel SP1, a second subpixel SP2, a third subpixel SP3 and a fourth subpixel SP4. The first subpixel SP1 may include a first light emission area EA1 emitting light of a first color, the second subpixel SP2 may include a second light emission area EA2 emitting light of a second color, the third subpixel SP3 may include a third light emission area EA3 emitting light of a third color and the fourth subpixel SP4 may include a fourth light emission area EA4 emitting light of a fourth color.

The first to fourth light emission areas EA1, EA2, EA3 and EA4 may emit light of different colors. For example, the first light emission area EA1 may emit green light, the second light emission area EA2 may emit blue light, the third light emission area EA3 may emit white light and the fourth light emission area EA4 may emit red light, but the embodiments of the present disclosure are not limited thereto. For example, various modifications may be made in the arrangement order or arrangement form of each of the subpixels SP1, SP2, SP3 and SP4.

The first to fourth subpixels SP1, SP2, SP3 and SP4 may be disposed in a quad-type matrix along the first direction (or Y-axis direction) and the second direction (or X-axis direction). For example, the first subpixel SP1 and the second subpixel SP2 may be disposed to be adjacent to the pixel power line VDDL (or the first power line), and the third subpixel SP3 and the fourth subpixel SP4 may be disposed to be adjacent to the common power line VSSL (or the second power line), but the embodiments of the present disclosure are not limited thereto.

Circuit areas of the first to fourth subpixels SP1, SP2, SP3 and SP4 may include a capacitor Cst, at least one of thin film transistor DRT, TR1 and TR2 and a light emitting element ED, as shown in FIG. 2. For example, at least one of thin film transistor DRT, TR1 and TR2 may include a driving transistor DTR, a first switching transistor TR1 and a second switching transistor TR2. Also, the light emitting element ED may include a first electrode (or an anode electrode or a pixel electrode), a light emitting layer (or an organic light emitting layer) and a second electrode (or a cathode electrode or a common electrode).

The transparent display panel 110 according to the embodiment of the present disclosure may further include at least one undercut line UCL extended in the second direction (or X-axis direction) in the display area AA.

At least one undercut line UCL may be disposed in the non-transmissive area NTA of the display area AA. At least one undercut line UCL may be disposed in the first non-transmissive area NTA1 and the second non-transmissive area NTA2. For example, at least one undercut line UCL may be extended in the second direction (or X-axis direction) and configured to cross the first non-transmissive area NTA1 and the second non-transmissive area NTA2. At least one undercut line UCL may be configured to be extended from the non-display area NA to the display area AA.

At least one undercut line UCL may serve to disconnect the light emitting layer (or the organic light emitting layer), which is formed in the non-transmissive area NTA, from the display area AA. At least one undercut line UCL may be provided as a portion of at least one protective layer (e.g., a planarization layer and a passivation layer). For example, at least one undercut line UCL may be provided by removing at least a portion of at least one protective layer (e.g., a planarization layer and a passivation layer). A scan line SCANL (or a gate line) may be disposed in the second non-transmissive area NTA2. At least one undercut line UCL may be adjacent to or overlap the scan line SCANL in the second non-transmissive area NTA2. A block pattern may be further included at a portion where at least one undercut line UCL and the scan line SCANL overlap each other. For example, the block pattern may prevent the scan line SCANL, which overlaps a lower portion of at least one undercut line UCL, from being damaged in the process of forming at least one undercut line UCL.

At least one undercut line UCL may be disposed to be adjacent to the scan line SCANL in the first non-transmissive area NTA1 and the second non-transmissive area NTA2. At least one undercut line UCL may disconnect the light emitting layer (or the organic light emitting layer) extended from adjacent pixels P with the scan line SCANL interposed therebetween in the first non-transmissive area NTA1 and the second non-transmissive area NTA2. For example, at least one undercut line UCL may disconnect the light emitting layers (or the organic light emitting layers) of the pixels P of an upper side and the other side with the second non-transmissive area NTA2 interposed therebetween. Also, at least one undercut line UCL may be configured by removing at least a portion of at least one protective layer (e.g., a planarization layer and a passivation layer). For example, at least one protective layer may include an organic insulating layer, and at least one undercut line UCL may be configured by removing at least a portion of the organic insulating layer, thereby disconnecting the organic insulating layer. Therefore, at least one undercut line UCL may constitute a boundary line in which the organic emission layer and/or the organic insulating layer are continuously disconnected in the second direction (or X-axis direction), and moisture permeation flowing from the upper side or the lower side in the first direction (or Y-axis direction) may be avoided based on the boundary line by at least one undercut line UCL. The outside of the boundary line by at least one undercut line UCL may be a cutting possible area capable of preventing moisture permeation toward the pixel P even though it is cut (or separated) by a cutting device such as a laser or a wheel. Therefore, the transparent display panel 110 according to the embodiment of the present disclosure provides a cutting possible area by at least one undercut line UCL crossing the non-transmissive area NTA in the second direction (or X-axis direction), so that a cuttable transparent display panel, which may be manufactured by being divided into various sizes depending on the field to which the transparent display panel 110 is applied and the usage thereof, may be implemented or realized.

Figure 4:
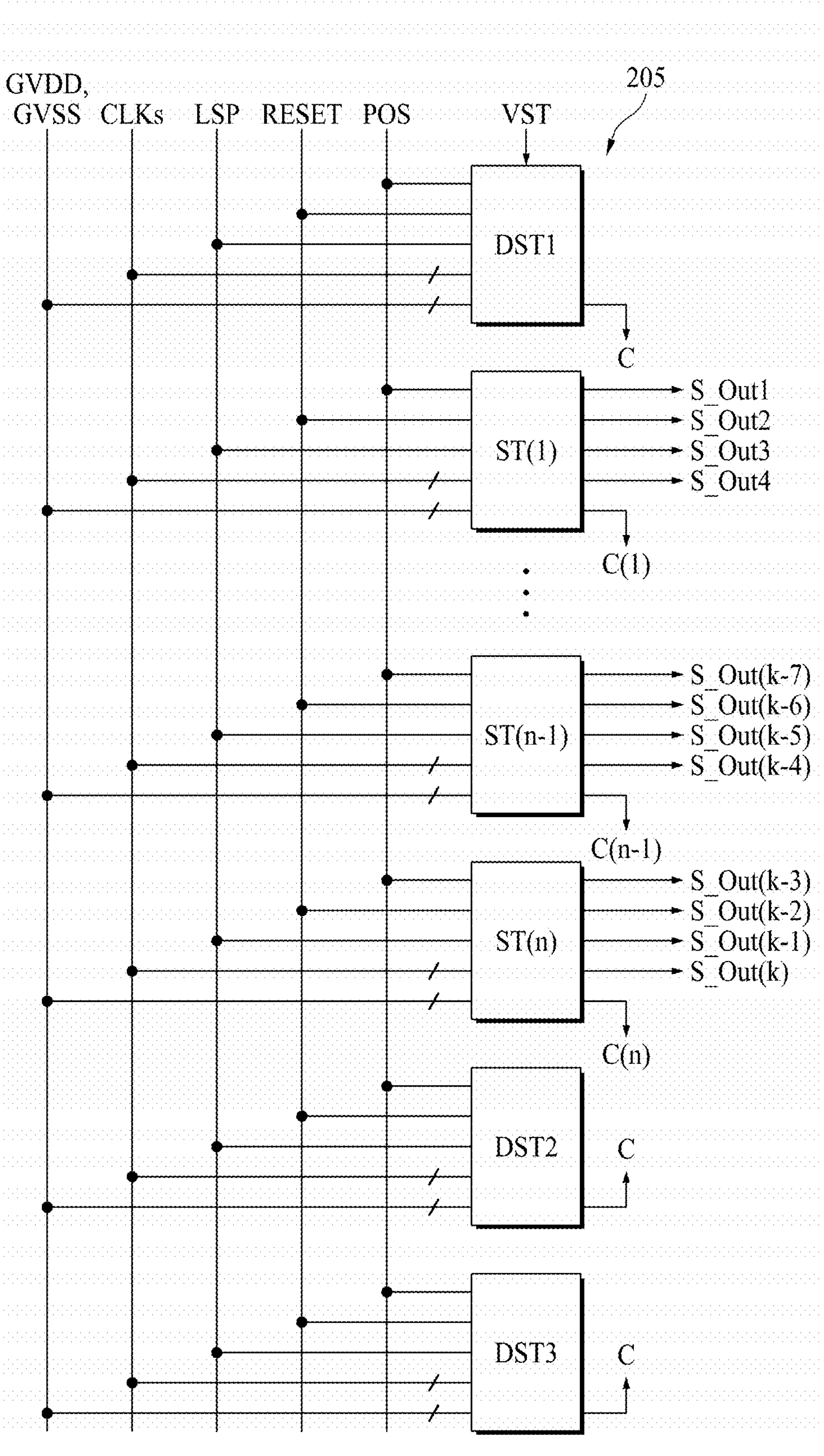
FIG. 4 is a view illustrating a plurality of stage circuits included in a gate driving circuit according to the embodiment of the present disclosure.

FIG. 4 is a view illustrating a plurality of stage circuits included in a gate driving circuit according to the embodiment of the present disclosure. FIG. 5 is a view illustrating a stage circuit according to the embodiment of the present disclosure.

Referring to FIGS. 4 and 5, the gate driving circuit 205 according to one embodiment of the present disclosure may include first to (n)th stage circuits ST(1) to ST(n) and at least one dummy stage circuit DST1, DST2 or DST3. For example, at least one dummy stage circuit DST1, DST2 or DST3 may include a front end dummy stage circuit DST1 disposed at a front end of the first stage circuit ST(1) and rear end dummy stage circuits DST2 and DST3 disposed at a rear end of the (n)th stage circuit ST(n). For example, the rear end dummy stage circuits DST2 and DST3 may be configured as a plurality of rear end dummy stage circuits.

A high-potential voltage GVDD and a low-potential voltage GVSS may be supplied from a power supply circuit to the first to (n)th stage circuits ST(1) to ST(n) and at least one dummy stage circuit DST1, DST2 or DST3. For example, a plurality of high-potential voltages GVDD having different voltage levels may be supplied through different voltage lines. Also, a plurality of low-potential voltages GVSS having different voltage levels may be supplied through different voltage lines, but the embodiments of the present disclosure are not limited thereto.

A plurality of clock signals CLKs may be supplied from the timing controller to the first to (n)th stage circuits ST(1) to ST(n) and at least one dummy stage circuit DST1, DST2 or DST3. For example, the plurality of clock signals CLKs may include a carry clock signal CRCLK and a plurality of scan clock signals CLK1, CLK2, CLK3 and CLK4.

A line sensing ready signal LSP may be supplied from the timing controller to the first to (n)th stage circuits ST(1) to ST(n). For example, the line sensing ready signal LSP may be also supplied to at least one dummy stage circuit DST1, DST2 or DST3.

A reset signal RESET may be supplied from the timing controller to the first to (n)th stage circuits ST(1) to ST(n) and at least one dummy stage circuit DST1, DST2 or DST3.

A panel-on signal POS may be supplied from the timing controller to the first to (n)th stage circuits ST(1) to ST(n) and at least one dummy stage circuit DST1, DST2 or DST3.

The front end dummy stage circuit DST1 may output a front end carry signal C in response to the input of a gate start signal VST supplied from the timing controller. The front end carry signal C may be supplied to at least one of the first to (n)th stage circuits ST(1) to ST(n).

The rear end dummy stage circuits DST2 and DST3 may output a rear end carry signal C. The rear end carry signal C may be supplied to at least one of the first to (n)th stage circuits ST(1) to ST(n).

The first to (n)th stage circuits ST(1) to ST(n) may be connected to be stepped or cascaded to each other, and may be also connected to be cascaded to the dummy stage circuits DST1, DST2 and DST3. For example, the first to (n)th stage circuits ST(1) to ST(n) and the dummy stage circuits DST1, DST2 and DST3 may be disposed to be extended in the first direction (or Y-axis direction) in the non-display area NA.

Each of the first to (n)th stage circuits ST(1) to ST(n) according to one embodiment of the present disclosure may output a plurality of output signals S_Out (or gate signals) and a carry signal C. For example, an arbitrary stage circuit may output four output signals S_Out and one carry signal C.

Referring to FIG. 4, each of the first to (n)th stage circuits ST(1) to ST(n) may output four output signals, and may output one carry signal. For example, the first stage circuit ST(1) may output a first output signal S_Out1, a second output signal S_Out2, a third output signal S_Out3, a fourth output signal S_Out4 and a carry signal C(1), and the (n)th stage circuit ST(n), which is the last stage of the first to (n)th stage circuits ST(1) to ST(n), may output a first output signal S_Out(k−3), a second output signal S_Out(k−2), a third output signal S_Out(k−1), a fourth output signal S_Out(k−1) and a carry signal C(n), and the (n−1)th stage circuit, which is a previous stage of the (n)th stage circuit ST(n), may output a first output signal S_Out(k−7), a second output signal S_Out(k−6), a third output signal S_Out(k−5), a fourth output signal S_Out(k−4) and a carry signal C(n−1).

The number of output signals output by the first to (n)th stage circuits ST(1) to ST(n) may correspond to the number of scan lines SCANL (or gate lines) disposed in the transparent display panel 110. For example, when the number of scan lines SCANL (or gate lines) is 400, the fourth output signal S_Out(k) of the (n)th stage circuit ST(n) may be the (400)th output signal, and the (n)th stage circuit ST(n) may be the (100)th stage circuit of k/4, but the embodiments of the present disclosure are not limited thereto. Each of the first to (n)th stage circuits ST(1) to ST(n) according to one embodiment of the present disclosure is configured to output a plurality of output signals through a common circuit unit, so that a thin film transistor and a signal line of the stage circuit may be reduced to implement or realize a gate driving circuit having a low area structure.

Referring to FIG. 5, the stage circuit ST(n) according to one embodiment of the present disclosure may include an output portion OP for outputting a plurality of output signals, and a node control portion NCP for controlling voltaes of a Q node Q and a Qb node Qb to control a plurality of output signals.

The output portion OP may output a plurality of output signals C(n), S_Out(k−3), S_Out(k−2), S_Out(k−1) and S_Out(k) based on a voltage level of the plurality of clock signals CRCLK, CLK1, CLK2, CLK3 and CLK4 or a level of a low-potential voltage GVSS0 in accordance with a voltage level of the Q node Q or a voltage level of the Qb node Qb.

The output portion OP may include carry signal output buffers Tu_CR and Td_CR, which consist of a carry pull-up transistor Tu_CR and a carry pull-down transistor Td_CR, to output the carry signal C(n). The carry signal output buffers Tu_CR and Td_CR may be connected in series between a terminal to which the carry clock signal CRCLK is applied and a terminal to which the low-potential voltage GVSS0 is applied, and may output the carry signal C(n) depending on the voltage level of the Q node Q or the voltage level of the Qb node Qb. For example, when the voltage of the Q node Q is a high level, the carry signal output buffers Tu_CR and Td_CR may output the carry signal C(n) having a first voltage level corresponding to the carry clock signal CRCLK. Also, when the voltage of the Qb node Qb is a high level, the carry signal output buffers Tu_CR and Td_CR may output the carry signal C(n) having a second voltage level corresponding to the low-potential voltage GVSS0.

The output portion OP may include a plurality of scan signal output buffers that output a plurality of scan signals. For example, the output portion OP may include first to fourth scan signal output buffers Tu1 to Tu4 and Td1 to Td4 that output four scan signals S_Out(k−3), S_Out(k−2), S_Out(k−1) and S_Out(k). For example, the first to fourth scan signal output buffers Tu1 to Tu4 and Td1 to Td4 may include first scan signal output buffers Tu1 and Td1, second scan signal output buffers Tu2 and Td2, third scan signal output buffers Tu3 and Td3 and fourth scan signal output buffers Tu4 and Td4.

The first scan signal output buffers Tu1 and Td1 may consist of a first scan pull-up transistor Tu1 and a first scan pull-down transistor Td1 to output the first scan signal S_Out(k−3). The first scan signal output buffers Tu1 and Td1 may be connected in series between a terminal to which the first scan clock signal CLK1 is applied and the terminal to which the low-potential voltage GVSS0 is applied, and may output the first scan signal S_Out(k−3) depending on the voltage level of the Q node Q or the voltage level of the Qb node Qb. For example, when the voltage of the Q node Q is a high level, the first scan signal output buffers Tu1 and Td1 may output the first scan signal S_Out(k−3) having a first voltage level corresponding to the first scan clock signal CLK1. Also, when the voltage of the Qb node Qb is a high level, the first scan signal output buffers Tu1 and Td1 may output the first scan signal S_Out(k−3) having a second voltage level corresponding to the low-potential voltage GVSS0.

The second scan signal output buffers Tu2 and Td2 may consist of a second scan pull-up transistor Tu2 and a second scan pull-down transistor Td2 to output the second scan signal S_Out(k−2). The second scan signal output buffers Tu2 and Td2 may be connected in series between a terminal to which the second scan clock signal CLK2 is applied and the terminal to which the low-potential voltage GVSS0 is applied, and may output the second scan signal S_Out(k−2) depending on the voltage level of the Q node Q or the voltage level of the Qb node Qb. For example, when the voltage of the Q node Q is at a high level, the second scan signal output buffers Tu2 and Td2 may output the second scan signal S_Out(k−2) having a first voltage level corresponding to the second scan clock signal CLK2. Also, when the voltage of the Qb node Qb is at a high level, the second scan signal output buffers Tu2 and Td2 may output the second scan signal S_Out(k−2) having a second voltage level corresponding to the low-potential voltage GVSS0.

The third scan signal output buffers Tu3 and Td3 may consist of a third scan pull-up transistor Tu3 and a third scan pull-down transistor Td3 to output the third scan signal S_Out(k−1). The third scan signal output buffers Tu3 and Td3 may be connected in series between a terminal to which the third scan clock signal CLK3 is applied and the terminal to which the low-potential voltage GVSS0 is applied and may output the third scan signal S_Out(k−1) according to the voltage level of the Q node Q or the voltage level of the Qb node Qb. For example, when the voltage of the Q node Q is a high level, the third scan signal output buffers Tu3 and Td3 may output the third scan signal S_Out(k−1) having a first voltage level corresponding to the third scan clock signal CLK3. Also, when the voltage of the Qb node Qb is a high level, the third scan signal output buffers Tu3 and Td3 may output the third scan signal S_Out(k−1) having a second voltage level corresponding to the low-potential voltage GVSS0.

The fourth scan signal output buffers Tu4 and Td4 may consist of a fourth scan pull-up transistor Tu4 and a fourth scan pull-down transistor Td4 to output the fourth scan signal S_Out(k). The fourth scan signal output buffers Tu4 and Td4 may be connected in series between a terminal to which the fourth scan clock signal CLK4 is applied and the terminal to which the low-potential voltage GVSS0 is applied, and may output the fourth scan signal S_Out(k) depending on the voltage level of the Q node Q or the voltage level of the Qb node Qb. For example, when the voltage of the Q node Q is a high level, the fourth scan signal output buffers Tu4 and Td4 may output the fourth scan signal S_Out(k) having a first voltage level corresponding to the fourth scan clock signal CLK4. Also, when the voltage of the Qb node Qb is a high level, the fourth scan signal Tu4 and Td4 may output the fourth scan signal S_Out(k) having a second voltage level corresponding to the low-potential voltage GVSS0.

The node control portion NCP is a circuit for controlling a voltage of each of the Q node Q and the Qb node Qb and may include a plurality of thin film transistors.

The node control portion NCP may start output operations of the plurality of output signals C(n), S_Out(k−3), S_Out (k−2), S_Out(k−1) and S_Out(k) in response to the line sensing ready signal LSP. The node control portion NCP may include a discharge transistor DC_TR for charging the voltage of the Q node Q in response to the start signal VST and discharging the voltage of the Q node Q to the level of the low-potential voltage (GVSS) in response to a global reset signal.

The discharging operation of the discharge transistor DC_TR may be controlled by the rear carry signal C(n+2) supplied from a rear stage circuit. The discharge transistor DC_TR may be connected in series between the Q node Q and a line of the low-potential voltage GVSS, and may discharge the Q node Q to the level of the low-potential voltage GVSS in response to the input of the rear carry signal C(n+2) applied from a rear stage circuit ST(n+2). For example, the discharge transistor DC_TR may be composed of two thin film transistors connected in series. For example, a drain node (or a source node) of one of the two discharge transistors DC_TR may be electrically connected to the Q node Q, and a source node (or a drain node) of the other discharge transistor DC_TR may be electrically connected to the terminal to which the low-potential voltage GVSS is applied.

The transparent display panel 110 according to the embodiment of the present disclosure may provide the cutting possible area by the undercut line UCL crossing the non-display area NA and the display area AA in the second direction (or X-axis direction), thereby implementing or realizing a cuttable transparent display panel, which may be manufactured by being divided into various sizes depending on the field to which the transparent display panel 110 is applied and the usage thereof. However, in the transparent display panel 110 according to the embodiment of the present disclosure, when the cutting possible area is cut (or separated), the rear carry signal C(n+2) cannot be applied to the front stage circuit based on the cut portions of the first to (n)th stage circuits ST(1) to ST(n) connected to be cascaded to each other in the first direction (or Y-axis direction). As a result, among the plurality of thin film transistors constituting the node control portion NCP, the discharge transistor DC_TR controlled by the rear carry signal C(n+2) is floated so that the voltage of the Q node Q may be discharged without being maintained, resulting in an abnormal operation in which a carry signal and an output signal are not output. Therefore, the inventors of the present disclosure have invented a gate driving circuit of a new structure and a transparent display apparatus comprising the same, in which an abnormal operation of a stage circuit due to cutting (or separation) of the transparent display panel 110 is prevented from occurring, through various studies and experiments.

Hereinafter, a gate driving circuit and a transparent display apparatus comprising the same according to another embodiment of the present disclosure, in which an abnormal operation of a stage circuit due to cutting (or separation) of the transparent display panel 110 is prevented from occurring, will be described in more detail with reference to FIGS. 6 to 20.

Figure 6:
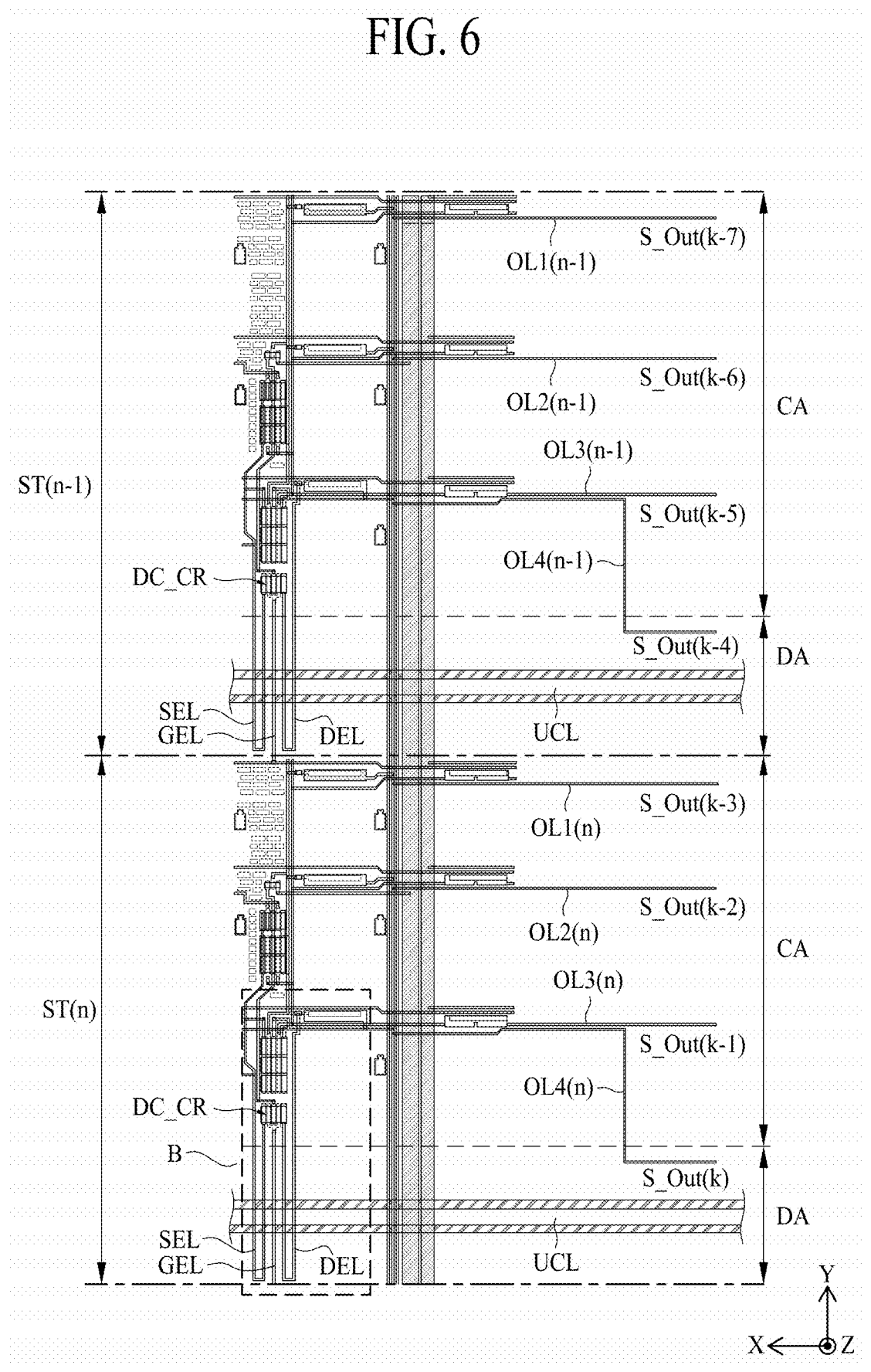
Figure 7:
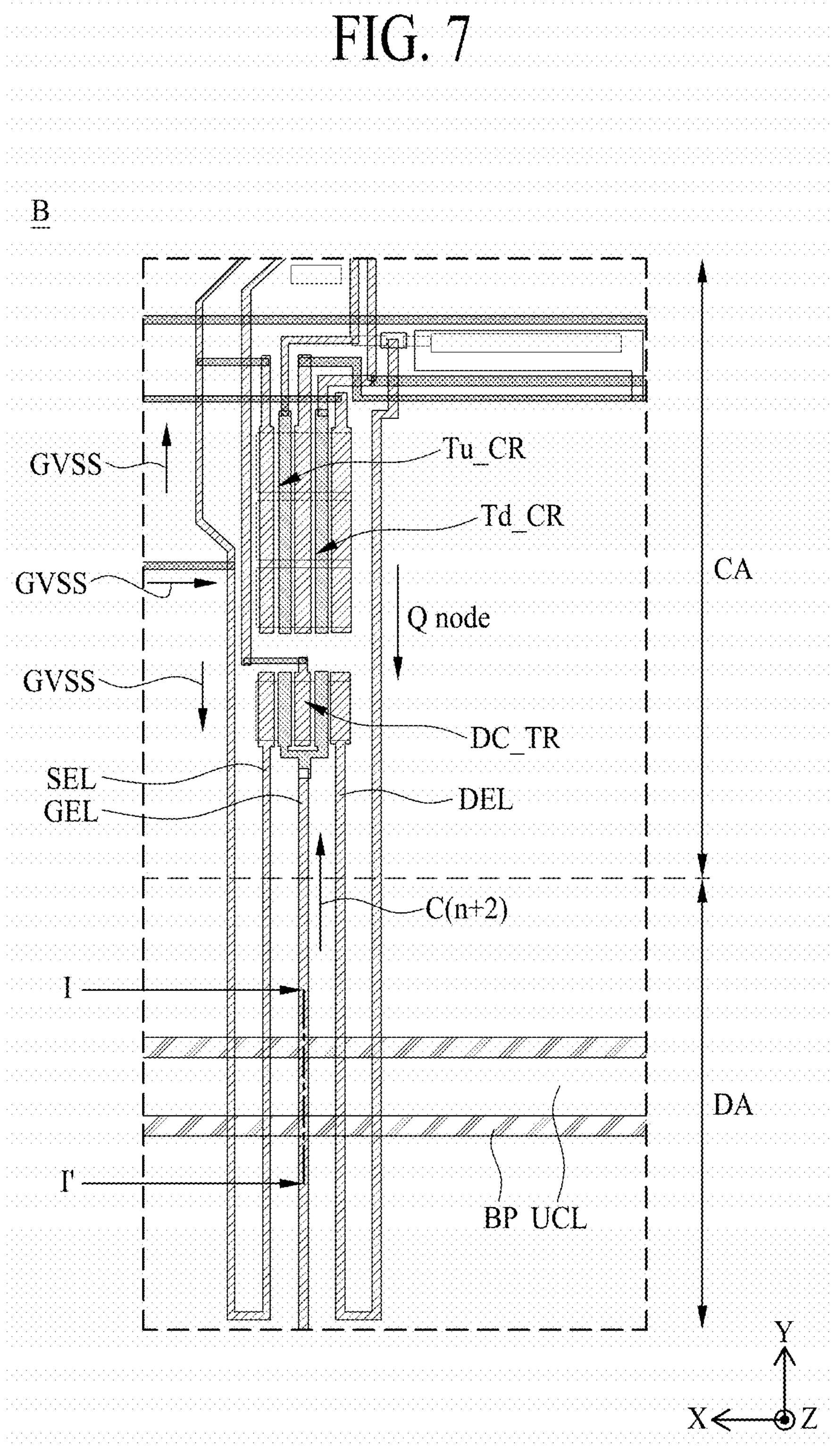
FIG. 7 is a view illustrating an area B shown in FIG. 6 according to another embodiment of the present disclosure.
Figure 8:
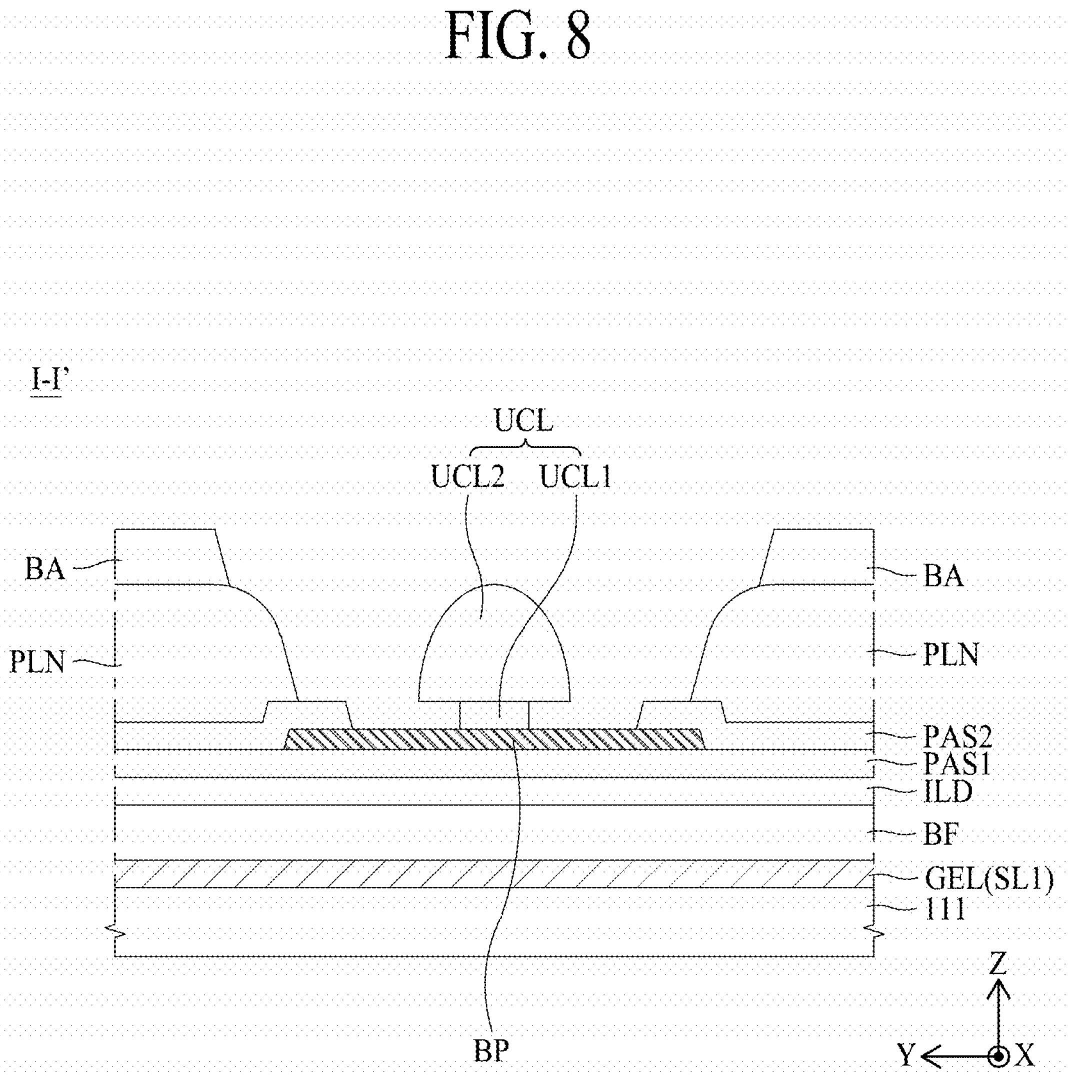
FIG. 8 is a cross-sectional view taken along line I-I' shown in FIG. 7 according to the embodiment of the present disclosure.

FIG. 6 is a view illustrating a layout of a stage circuit according to another embodiment of the present disclosure. FIG. 7 is a view illustrating an area B shown in FIG. 6 according to another embodiment of the present disclosure. FIG. 8 is a cross-sectional view taken along line I-I' shown in FIG. 7 according to the embodiment of the present disclosure.

Referring to FIGS. 6 to 8, the transparent display panel 110 according to another embodiment of the present disclosure may include a plurality of stage circuits ST(n−1) and ST(n).

Each of the plurality of stage circuits ST(n−1) and ST(n) may include a circuit area CA in which a circuit portion including at least one thin film transistor for controlling the output of a plurality of output signals is disposed, and a dummy area DA in which an undercut line UCL extended in the second direction (or X-axis direction) crossing the first direction (or Y-axis direction) is disposed. For example, the dummy area DA may be configured so as not to overlap the circuit unit including at least one thin film transistor.

Each of the plurality of stage circuits ST(n−1) and ST(n) may be configured to output a plurality of output signals S_Out(k−7) to S_Out(k). For example, each of the plurality of stage circuits ST(n−1) and ST(n) may be configured to output four output signals S_Out(k−7) to S_Out(k−4) and S_Out(k−3) to S_Out(k).

The (n−1)th stage circuit ST(n−1) may simultaneously supply four output signals S_Out(k−7) to S_Out(k−4) to the pixels P disposed in each of four horizontal lines parallel with the second direction (or X-axis direction), and the (n)th stage circuit ST(n) may simultaneously supply four output signals S_Out(k−3) to S_Out(k) to the pixels disposed in each of four horizontal lines parallel with the second direction (or X-axis direction). For example, each of the plurality of stage circuits ST(n−1) and ST(n) may be configured to have a length corresponding to the pixels P disposed in the four horizontal lines in the first direction (or Y-axis direction).

Each of the plurality of stage circuits ST(n−1) and ST(n) may include a circuit area CA and a dummy area DA, and the circuit area CA and the dummy area DA may be disposed to be adjacent to each other in the first direction (or Y-axis direction). The dummy area DA may be disposed on a lowermost end of each of the plurality of stage circuits ST(n−1) and ST(n).

The circuit area CA may be disposed to correspond to at least a portion of a plurality of horizontal lines connected to each of the plurality of stage circuits ST(n−1) and ST(n), and the dummy area DA may be disposed to correspond to the other portion of the plurality of horizontal lines connected to each of the plurality of stage circuits ST(n−1) and ST(n). For example, the circuit area CA may be disposed to correspond to three horizontal lines among four horizontal lines connected to each of the plurality of stage circuits ST(n−1) and ST(n), and the dummy area DA may be disposed to correspond to the remaining one of the four horizontal lines connected to each of the plurality of stage circuits ST(n−1) and ST(n), but the embodiments of the present disclosure are not limited thereto. For example, in the (n−1)th stage circuit ST(n−1), a plurality of thin film transistors for controlling the output of the four output signals S_Out(k−7) to S_Out (k−4) may be disposed in the circuit area CA, and at least a portion of the four output signal lines OL1(*n*−1) to OL4(*n*−1) corresponding to each of the four output signals S_Out (k−7) to S_Out(k−4) may be disposed in the circuit area CA, and the remaining portion thereof may be disposed in the dummy area DA. For example, three OL1(*n*−1), OL2(*n*−1) and OL3(*n*−1) of the four output signal lines OL1(*n*−1) to OL4(*n*−1) may be disposed in the circuit area CA of the (n−1)th stage circuit ST(n−1), and one OL4(*n*−1) of the four output signal lines OL1(*n*−1) to OL4(*n*−1) may be disposed in the dummy area DA of the (n−1)th stage circuit ST(n−1), but the embodiments of the present disclosure are not limited thereto. In addition, in the (n)th stage circuit ST(n), a plurality of thin film transistors for controlling the output of the four output signals S_Out(k−3) to S_Out(k) may be disposed in the circuit area CA, and at least a portion of the four output signal lines OL1(*n*) to OL4(*n*) corresponding to each of the four output signals S_Out(k−3) to S_Out(k) may be disposed in the circuit area CA and the remaining portion thereof may be disposed in the dummy area DA. For example, three OL1(*n*), OL2(*n*), OL3(*n*) of the four output signal lines OL1(*n*) to OL4(*n*) may be disposed in the circuit area CA of the (n)th stage circuit ST(n), and one OL4(*n*) of the four output signal lines OL1(*n*) to OL4(*n*) may be disposed in the dummy area DA of the (n)th stage circuit ST(n), but the embodiments of the present disclosure are not limited thereto.

Referring to FIG. 7, the discharge transistor DC_TR and at least one thin film transistor Tu_CR or Td_CR may be disposed at a portion adjacent to the dummy area DA in the circuit area CA of each of the stage circuits ST(n−1) and ST(n). For example, the discharge transistor DC_TR may be disposed to be adjacent to the dummy area DA. The discharge transistor DC_TR may control charging and discharging of a Q node voltage controlling the plurality of output signals.

The discharge transistor DC_TR may include at least one signal line. At least one signal line of the discharge transistor DC_TR may include a gate electrode line GEL, a source electrode line SEL and a drain electrode line DEL. For example, the gate electrode line GEL may be connected to a gate electrode of the discharge transistor DC_TR, and a rear carry signal C(n+2) may be applied from the rear stage circuit. The source electrode line SEL may be connected to a source electrode of the discharge transistor DC_TR, and the low-potential voltage GVSS may be applied from the low-potential terminal. The drain electrode line DEL may be connected to a drain electrode of the discharge transistor DC_TR, and may be electrically connected to the Q node Q.

The gate electrode line GEL, the source electrode line SEL and the drain electrode line DEL of the discharge transistor DC_TR may be disposed in the dummy area DA. At least a portion of the signal line such as the gate electrode line GEL, the source electrode line SEL and the drain electrode line DEL of the discharge transistor DC_TR may cross and overlap the undercut line UCL disposed in the dummy area DA. For example, the source electrode line SEL and the drain electrode line DEL of the discharge transistor DC_TR may be bent at least twice to cross the undercut line UCL at least twice. The source electrode line SEL and the drain electrode line DEL of the discharge transistor DC_TR may have a bent portion disposed below the undercut line UCL in the first direction (or Y-axis direction).

The gate electrode line GEL, the source electrode line SEL and the drain electrode line DEL of the discharge transistor DC_TR may be configured to be independently branched from signal lines of other thin film transistors in the circuit area CA. For example, the source electrode line SEL of the discharge transistor DC_TR may be connected to the low-potential voltage GVSS independently of other thin film transistors in the circuit area CA. The drain electrode line DEL of the discharge transistor DC_TR may be connected to the Q node Q independently of other thin film transistors in the circuit area CA.

In the dummy area DA of each of the stage circuits ST(n−1) and ST(n) according to another embodiment of the present disclosure, the undercut line UCL extended in the second direction (or X-axis direction) may be disposed. The dummy area DA of each of the stage circuits ST(n−1) and ST(n) may be a cutting possible area that may be cut (or separated) by a cutting device such as a laser or a wheel. For example, the dummy area DA of each of the stage circuits ST(n−1) and ST (n) may be a cutting possible area in which a lower end portion in the first direction (or Y-axis direction) based on the undercut line UCL may be cut.

In the transparent display panel 110 according to another embodiment of the present disclosure, when the cutting possible area is cut (or separated), at least one stage circuit may be configured as a dummy stage circuit based on the cut portion. For example, a stage circuit, in which the dummy area DA is cut (or separated), among the plurality of stage circuits ST(n−1) and ST(n) may be the dummy stage circuit. Also, at least one front stage circuit, in which the dummy area DA is cut (or separated), among the plurality of stage circuits ST(n−1) and ST(n) may be the dummy stage circuit. The dummy stage circuit may be configured by electrically removing (or separating) the discharge transistor DC_TR. For example, the dummy stage circuit may be configured by separating or disconnecting the gate electrode line GEL, the source electrode line SEL and the drain electrode line DEL of the discharge transistor DC_TR disposed in the dummy area DA.

Referring to FIG. 8, in the dummy area DA of each of the stage circuits ST(n−1) and ST(n), a block pattern BP may be further included at a portion where the gate electrode line GEL, the source electrode line SEL and the drain electrode line DEL of the discharge transistor DC_TR cross the undercut line UCL. For example, the block pattern BP may prevent the gate electrode line GEL, the source electrode line SEL and the drain electrode line DEL of the discharge transistor DC_TR, which cross the lower portion of the undercut line UCL, from being damaged in the process of forming the undercut line UCL.

For example, at least one first signal line SL1 may be disposed on the substrate 111. The gate electrode line GEL, the source electrode line SEL and the drain electrode line DEL of the discharge transistor DC_TR may be disposed in the dummy area DA on the substrate 111. For example, at least one first signal line SL1 may be at least one of the data line DL, the pixel power line VDDL, the common power line VSSL and the reference line REFL, which is shown in FIG. 2, but the embodiments of the present disclosure are not limited thereto. Also, a light blocking layer which blocks external light incident to an active layer of a thin film transistor may be disposed on the substrate 111. The light blocking layer may be composed of a single layer or multi-layer made of any one of molybdenum (Mo), aluminum (Al), chromium (Cr), gold (Au), titanium (Ti), nickel (Ni), neodymium (Nd) and copper (Cu), or their alloy. The gate electrode line GEL, the source electrode line SEL and the drain electrode line DEL of the discharge transistor DC_TR disposed in the dummy area DA on the substrate 111 may be formed of the same material on the same layer as the light blocking layer, but the embodiments of the present disclosure are not limited thereto.

A buffer layer BF may be disposed on the substrate 111 in which the gate electrode line GEL, the source electrode line SEL and the drain electrode line DEL of the discharge transistor DC_TR and the light blocking layer are disposed. The buffer layer BF is to protect the thin film transistor from moisture permeated through the substrate 111 which may be vulnerable to moisture permeation, and may be formed of a single layer or multi-layer that includes an inorganic insulating material such as silicon oxide (SiOx), silicon nitride (SiNx) or aluminum oxide ($Al_2O_3$).

At least one insulating layer, a thin film transistor and at least one signal line may be disposed on the buffer layer BF. For example, the interlayer insulating layer ILD may be disposed on the buffer layer BF. The interlayer insulating layer ILD may be formed of a single layer or multi-layer that includes an inorganic insulating material such as silicon oxide (SiOx), silicon nitride (SiNx) and aluminum oxide ($Al_2O_3$).

A first passivation layer PAS1 may be disposed on the interlayer insulating layer ILD. A second passivation layer PAS2 may be disposed on the first passivation layer PAS1. Each of the first passivation layer PAS1 and the second passivation layer PAS2 may be formed of a single layer or multi-layer that includes an inorganic insulating material such as silicon oxide (SiOx), silicon nitride (SiNx) and aluminum oxide ($Al_2O_3$).

The block pattern BP may be disposed on the first passivation layer PAS1. For example, the block pattern BP may be formed at a portion where at least one first signal line SL1 and the undercut line UCL cross each other. The block pattern BP may be disposed in at least one insulating layer between the signal line of the discharge transistor DC_TR and the undercut line UCL. Also, the block pattern BP may be formed at a portion where the gate electrode line GEL, the source electrode line SEL and the drain electrode line DEL of the discharge transistor DC_TR cross the undercut line UCL. The block pattern BP is to prevent at least one first signal line SL1 or the gate electrode line GEL, the source electrode line SEL and the drain electrode line DEL of the discharge transistor DC_TR from being damaged from an etchant used when the undercut line UCL is formed. For example, the block pattern BP may be made of the same material as that of other signal lines formed on the first passivation layer PAS1.

A planarization layer PLN for planarizing a step difference caused by the thin film transistor and the plurality of signal lines may be disposed on the second passivation layer PAS2. The planarization layer PLN may be made of an organic material such as an acrylic resin, an epoxy resin, a phenolic resin, a polyamide resin and a polyimide resin. A first electrode, an organic light emitting layer and second electrodes of the light emitting element ED and a bank layer BA may be disposed on the planarization layer PLN.

In the dummy area DA on the substrate 111, the undercut line UCL may be configured using the planarization layer PLN and the second passivation layer PAS2. The undercut line UCL may be formed by removing at least a portion of the planarization layer PNL and the second passivation layer PAS2. The undercut line UCL may include a support line UCL1 consisting of at least one insulating layer between the second passivation layer PAS2 or the planarization layer PNL and the substrate 111, and an cave line UCL2 disposed on the support line UCL1 and protruded from the support line UCL1, consisting of the planarization layer PLN. The undercut line UCL may be disposed to be extended from the non-display area NA on the substrate 111 to the display area AA.

The transparent display panel 110 according to another embodiment of the present disclosure may provide the cutting possible area by the undercut line UCL crossing the non-display area NA and the display area AA in the second direction (or X-axis direction), thereby implementing or realizing a cuttable transparent display panel, which may be manufactured by being divided into various sizes depending on the field to which the transparent display panel 110 is applied and the usage thereof. Also, in the transparent display panel 110 according to another embodiment of the present disclosure, when the cutting possible area is cut (or separated), the dummy stage circuit may be configured by electrically removing (or separating) the discharge transistor DC_TR of at least one stage circuit based on the cut portion, thereby preventing an abnormal operation by the dummy stage circuit. At least one dummy stage circuit may be configured by separating or disconnecting the signal line of the discharge transistor DC_TR disposed in the dummy area DA.

Figure 9:
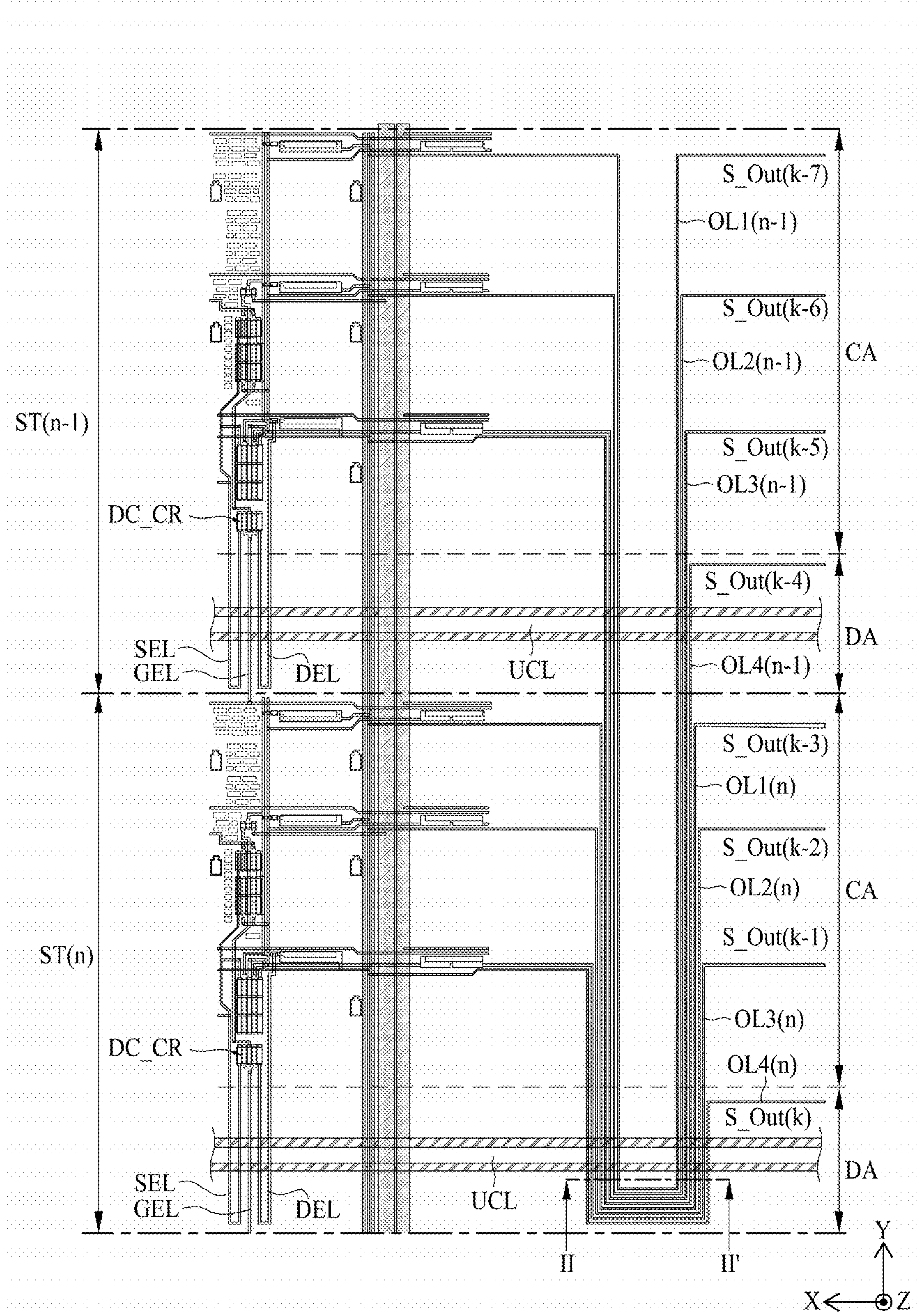
FIG. 9 is a view illustrating a layout of a stage circuit according to another embodiment of the present disclosure.
Figure 10:
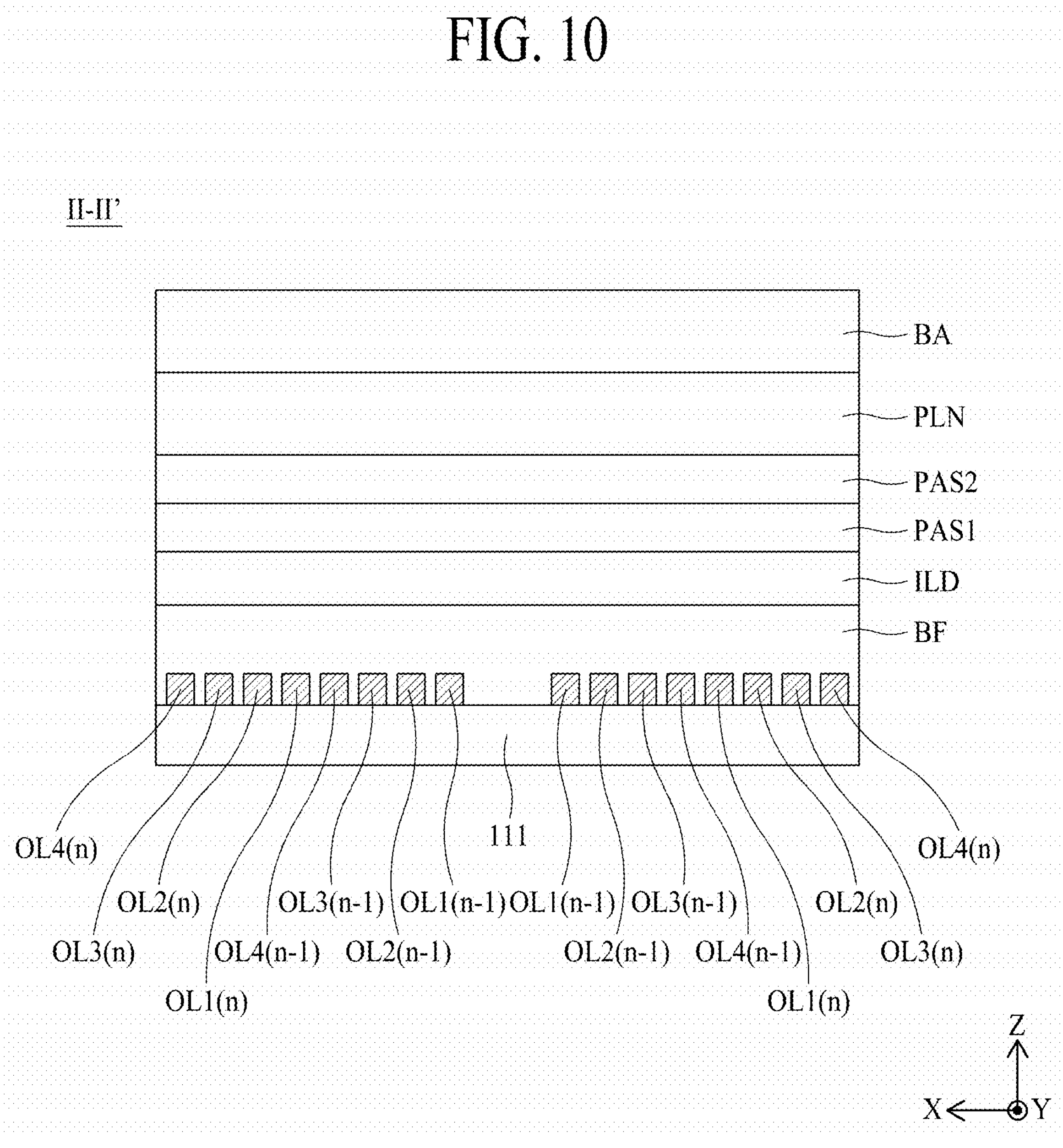
FIG. 10 is a cross-sectional view taken along line II-II' shown in FIG. 9 according to another embodiment of the present disclosure.

FIG. 9 is a view illustrating a layout of a stage circuit according to another embodiment of the present disclosure. FIG. 10 is a cross-sectional view taken along line II-II' shown in FIG. 9 according to another embodiment of the present disclosure. In FIGS. 9 and 10, the elements of the output signal lines are modified in the transparent display panel 110 described with reference to FIGS. 6 to 8. In the following description, the same reference numerals will be given to the other same elements except for the modified elements, and their redundant description will be omitted or briefly described.

Referring to FIGS. 9 and 10, the transparent display panel 110 according to another embodiment of the present disclosure may include a plurality of stage circuits ST(n−1) and ST(n).

The (n−1)th stage circuit ST(n−1) and the (n)th stage circuit ST(n) of the plurality of stage circuits may be adjacent to each other in the first direction (or Y-axis direction). The (n)th stage circuit ST(n) may be disposed at a lower end of the (n−1)th stage circuit ST(n−1) in the first direction. The (n−1)th stage circuit ST(n−1) and the (n)th stage circuit ST(n), which are adjacent to each other, may share at least a portion of the dummy area DA. For example, the dummy area DA of the (n)th stage circuit ST(n) may be shared with the (n−1)th stage circuit ST(n−1). For example, at least a portion of the output signal lines OL1 to OL4 of the (n−1)th stage circuit ST(n−1) and the (n)th stage circuit ST(n) may be disposed in the dummy area DA of the (n)th stage circuit ST(n).

The output signal lines OL1(*n*−1) to OL4(*n*−1) of the (n−1)th stage circuit ST(n−1) and the output signal lines OL1(*n*) to OL4(*n*) of the (n)th stage circuit ST(n) may be configured so as not to overlap each other on a plane.

The output signal lines OL1(*n*−1) to OL4(*n*−1) of the (n−1)th stage circuit ST(n−1) may be extended in the second direction (or X-axis direction) from the circuit area CA of the (n−1)th stage circuit ST(n−1) and then may be bent in the first direction (or Y-axis direction) to extend to the dummy area DA of the (n)th stage circuit ST(n). The output signal lines OL1(*n*−1) to OL4(*n*−1) of the (n−1)th stage circuit ST(n−1) may be extended in the first direction (or Y-axis direction) by being bent at least twice in the dummy area DA of the (n)th stage circuit ST(n), and then may be extended to the pixel P of the display area AA by being bent in the second direction (or X-axis direction) in the circuit area CA of the (n−1)th stage circuit ST(n−1). Therefore, the output signal lines OL1(*n*−1) to OL4(*n*−1) of the (n−1)th stage circuit ST(n−1) may be configured to cross each of the undercut line UCL of the (n−1)th stage circuit ST(n−1) and the undercut line UCL of the (n)th stage circuit ST(n) at least twice. The portions of the output signal lines OL1(*n*−1) to OL4(*n*−1) of the (n−1)th stage circuit ST(n−1), which are bent at least twice, may be disposed below the undercut line UCL of the (n)th stage circuit ST(n) in the dummy area DA of the (n)th stage circuit ST(n).

The output signal lines OL1(*n*) to OL4(*n*) of the (n)th stage circuit ST(n) may be extended in the second direction (or X-axis direction) from the circuit area CA of the (n)th stage circuit ST(n) and then may be bent in the first direction (or Y-axis direction) to extend to the dummy area DA of the (n)th stage circuit ST(n). The output signal lines OL1(*n*) to OL4(*n*) of the (n)th stage circuit ST(n) may be extended in the first direction (or Y-axis direction) by being bent at least twice in the dummy area DA of the (n)th stage circuit ST(n), and then may be extended to the pixel P of the display area AA by being bent in the second direction (or X-axis direction) in the circuit area CA of the (n)th stage circuit ST(n). Therefore, the output signal lines OL1(*n*) to OL4(*n*) of the (n)th stage circuit ST(n) may be configured to cross the undercut line UCL of the (n)th stage circuit ST(n) at least twice. The portions of the output signal lines OL1(*n*) to OL4(*n*) of the (n)th stage circuit ST(n), which are bent at least twice, may be disposed below the undercut line UCL of the (n)th stage circuit ST(n) in the dummy area DA of the (n)th stage circuit ST(n).

Referring to FIG. 10, the output signal lines OL1(*n*−1) to OL4(*n*−1) of the (n−1)th stage circuit ST(n−1) and the output signal lines OL1(*n*) to OL4(*n*) of the (n)th stage circuit ST(n) may be made of the same material on the same layer on the substrate 111. For example, the output signal lines OL1(*n*−1) to OL4(*n*−1) of the (n−1)th stage circuit ST(n−1) and the output signal lines OL1(*n*) to OL4(*n*) of the (n)th stage circuit ST(n) may be disposed on the substrate 111. The output signal lines OL1(*n*−1) to OL4(*n*−1) of the (n−1)th stage circuit ST(n−1) and the output signal lines OL1(*n*) to OL4(*n*) of the (n)th stage circuit ST(n) may be made of the same material on the same layer as the light blocking layer on the substrate 111.

In the (n−1)th stage circuit ST(n−1) and the (n)th stage circuit ST(n) according to another embodiment of the present disclosure, the dummy area DA of the (n)th stage circuit ST(n) may be a cutting possible area that may be cut (or separated) by a cutting device such as a laser or a wheel. For example, the dummy area DA of the (n)th stage circuit ST(n) may be a cutting possible area in which a lower end portion in the first direction (or Y-axis direction) based on the undercut line UCL may be cut.

In the transparent display panel 110 according to another embodiment of the present disclosure, when the dummy area DA of the (n)th stage circuit ST(n) is cut (or separated), the (n−1)th stage circuit ST(n−1) and the (n)th stage circuit ST(n) may be composed of first and second dummy stage circuits. For example, the (n−1)th stage circuit ST(n−1), which is a front end of the (n)th stage circuit ST(n) in which the dummy area DA is cut (or separated), may be a first dummy stage circuit, and the (n)th stage circuit ST (n) in which the dummy area DA is cut (or separated) may be a second dummy stage circuit. The first dummy stage circuit ST(n−1) and the second dummy stage circuit ST(n) may be configured such that the plurality of output signals S_Out (k−7) to S_Out(k−4) and S_Out(k−3) to S_Out(k) are not output. For example, the first dummy stage circuit ST(n−1) and the second dummy stage circuit ST(n) may be configured by separating or disconnecting the output signal lines OL1(*n*−1) to OL4(*n*−1) of the (n−1)th stage circuit ST(n−1) and the output signal lines OL1(*n*) to OL4(*n*) of the (n)th stage circuit ST(n) in the dummy area DA of the second dummy stage circuit ST(n).

The transparent display panel 110 according to another embodiment of the present disclosure may provide the cutting possible area by the undercut line UCL crossing the non-display area NA and the display area AA in the second direction (or X-axis direction), thereby implementing or realizing a cuttable transparent display panel, which may be manufactured by being divided into various sizes depending on the field to which the transparent display panel 110 is applied and the usage thereof. Also, in the transparent display panel 110 according to another embodiment of the present disclosure, when the cutting possible area is cut (or separated), the first and second dummy stage circuits may be configured by separating (or disconnecting) the output signal lines of at least two stage circuits based on the cut portion, thereby preventing the light emitting element disposed in the non-display area NA connected to the first and second dummy stage circuits from being abnormally lighted (or from abnormally emitting light).

Figure 11:
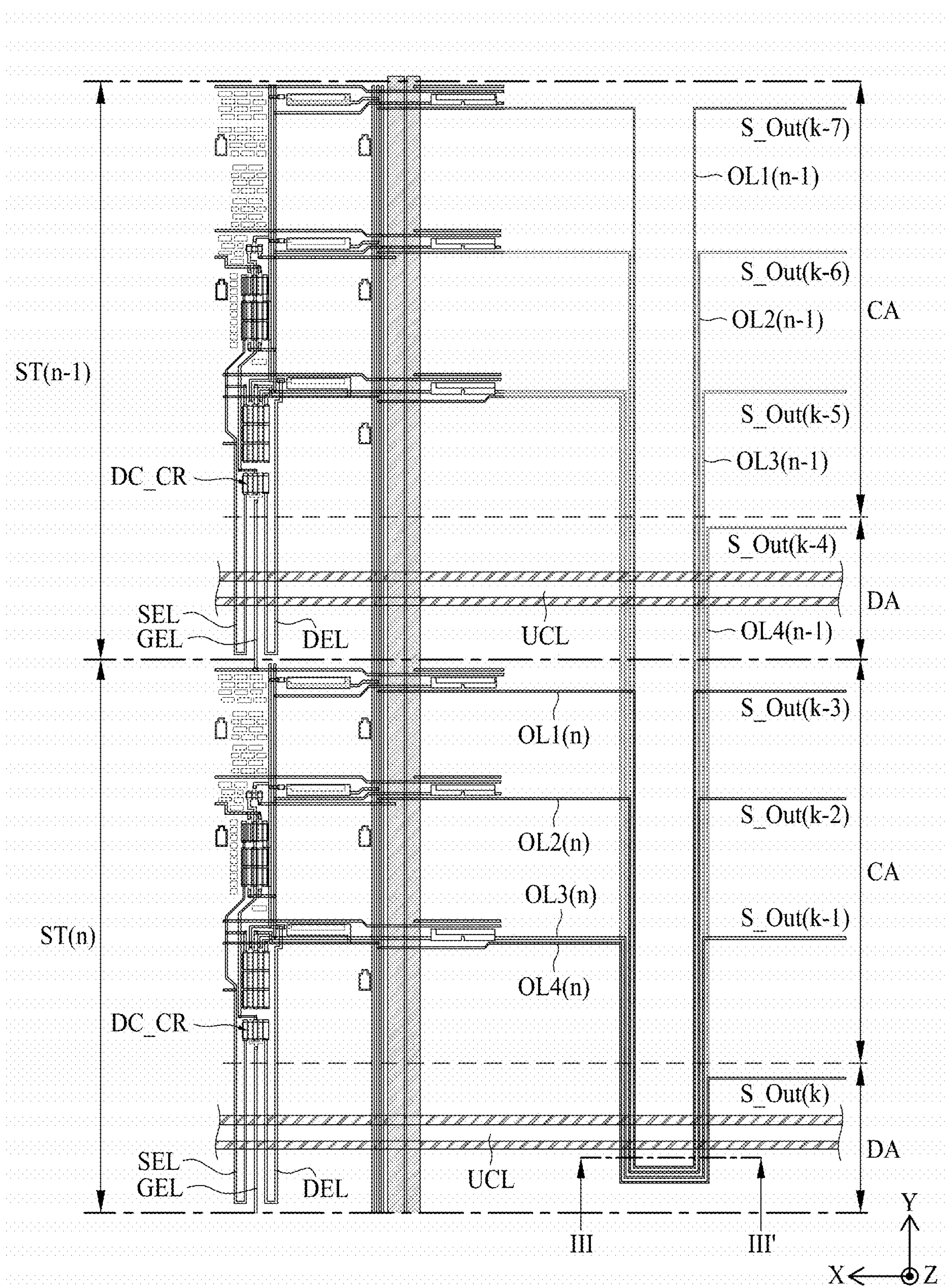
FIG. 11 is a view illustrating a layout of a stage circuit according to another embodiment of the present disclosure.
Figure 12:
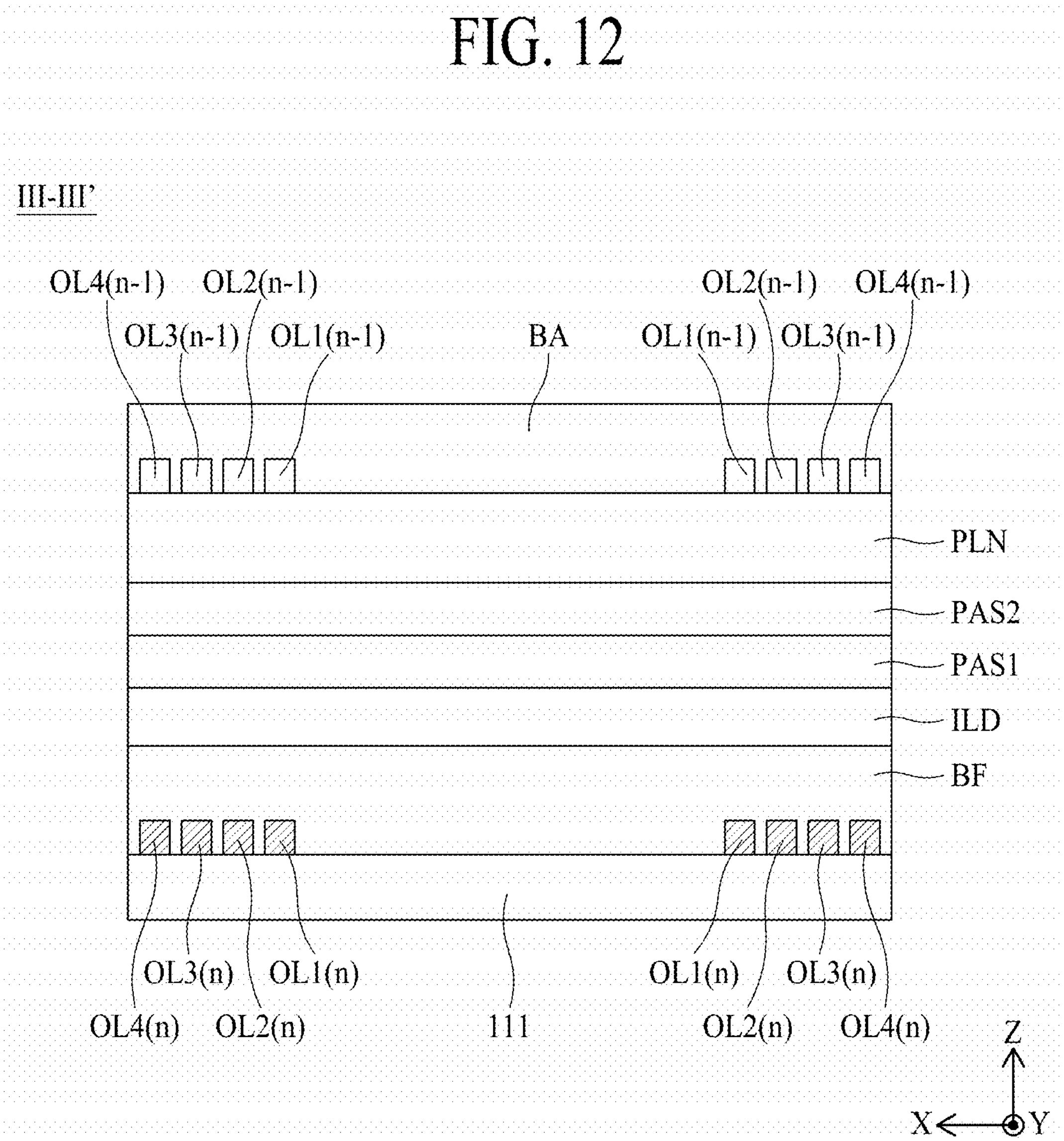
FIG. 12 is a cross-sectional view taken along line III-III' shown in FIG. 11 according to another embodiment of the present disclosure.

FIG. 11 is a view illustrating a layout of a stage circuit according to another embodiment of the present disclosure. FIG. 12 is a cross-sectional view taken along line III-III' shown in FIG. 11 according to another embodiment of the present disclosure. FIG. 13 is a cross-sectional view taken along line III-III' shown in FIG. 11 according to another embodiment of the present disclosure. In FIGS. 11 to 13, the elements of the output signal lines are modified in the transparent display panel 110 described with reference to FIGS. 6 to 10. In the following description, the same reference numerals will be given to the other same elements except for the modified elements, and their redundant description will be omitted or briefly described.

Referring to FIGS. 11 to 13, the transparent display panel 110 according to another embodiment of the present disclosure may include a plurality of stage circuits ST(n−1) and ST(n).

The output signal lines OL1(*n*−1) to OL4(*n*−1) of the (n−1)th stage circuit ST(n−1) and the output signal lines OL1(*n*) to OL4(*n*) of the (n)th stage circuit ST(n) may be configured to at least partially overlap each other on a plane. For example, the output signal lines OL1(*n*−1) to OL4(*n*−1) of the (n−1)th stage circuit ST(n−1) and the output signal lines OL1(*n*) to OL4(*n*) of the (n)th stage circuit ST(n) may be formed of different materials on different layers.

The output signal lines OL1(*n*−1) to OL4(*n*−1) of the (n−1)th stage circuit ST(n−1) may be extended in the second direction (or X-axis direction) from the circuit area CA of the (n−1)th stage circuit ST(n−1) and then may be bent in the first direction (or Y-axis direction) to extend to the dummy area DA of the (n)th stage circuit ST(n). The output signal lines OL1(*n*−1) to OL4(*n*−1) of the (n−1)th stage circuit ST(n−1) may be disposed to overlap the output signal lines OL1(*n*) to OL4(*n*) of the (n)th stage circuit ST(n). The output signal lines OL1(*n*−1) to OL4(*n*−1) of the (n−1)th stage circuit ST(n−1) may be extended in the first direction (or Y-axis direction) by being bent at least twice in the dummy area DA of the (n)th stage circuit ST(n), and then may be extended to the pixel P of the display area AA by being bent in the second direction (or X-axis direction) in the circuit area CA of the (n−1)th stage circuit ST(n−1). Therefore, the output signal lines OL1(*n*−1) to OL4(*n*−1) of the (n−1)th stage circuit ST(n−1) may be configured to cross each of the undercut line UCL of the (n−1)th stage circuit ST(n−1) and the undercut line UCL of the (n)th stage circuit ST(n) at least twice. The portions of the output signal lines OL1(n−1) to OL4(n−1) of the (n−1)th stage circuit ST(n−1), which are bent at least twice, may be disposed below the undercut line UCL of the (n)th stage circuit ST (n) in the dummy area DA of the (n)th stage circuit ST(n).

The output signal lines OL1(n) to OL4(n) of the (n)th stage circuit ST(n) may be extended in the second direction (or X-axis direction) from the circuit area CA of the (n)th stage circuit ST(n) and then may be bent in the first direction (or Y-axis direction) to extend to the dummy area DA of the (n)th stage circuit ST(n). The output signal lines OL1(n) to OL4(n) of the (n)th stage circuit ST(n) may be disposed to overlap the output signal lines OL1(n−1) to OL4(n−1) of the (n−1)th stage circuit ST(n−1). The output signal lines OL1 (n) to OL4(n) of the (n)th stage circuit ST(n) may be extended in the first direction (or Y-axis direction) by being bent at least twice in the dummy area DA of the (n)th stage circuit ST(n), and then may be extended to the pixel P of the display area AA by being bent in the second direction (or X-axis direction) in the circuit area CA of the (n) th stage circuit ST(n). Therefore, the output signal lines OL1(n) to OL4(n) of the (n)th stage circuit ST(n) may be configured to cross the undercut line UCL of the (n)th stage circuit ST(n) at least twice. The portions of the output signal lines OL1(n) to OL4(n) of the (n)th stage circuit ST(n), which are bent at least twice, may be disposed below the undercut line UCL of the (n)th stage circuit ST(n) in the dummy area DA of the (n)th stage circuit ST(n).

Referring to FIG. 12, the output signal lines OL1(n−1) to OL4(n−1) of the (n−1)th stage circuit ST(n−1) and the output signal lines OL1(n) to OL4(n) of the (n)th stage circuit ST(n) may be made of different materials on different layers on the substrate 111. For example, the output signal lines OL1(n−1) to OL4(n−1) of the (n−1)th stage circuit ST(n−1) may be made of the same material on the same layer as the first electrode (or the pixel electrode or the anode electrode) of the light emitting element disposed in the planarization layer PLN. Also, the output signal lines OL1 (n) to OL4(n) of the (n)th stage circuit ST(n) may be made of the same material on the same layer as the light blocking layer on the substrate 111.

Referring to FIG. 13, the output signal lines OL1(n−1) to OL4(n−1) of the (n−1)th stage circuit ST(n−1) may be disposed between the first passivation layer PAS1 and the second passivation layer PAS2. For example, the output signal lines OL1(n−1) to OL4(n−1) of the (n−1)th stage circuit ST(n−1) may be made of the same material as that of at least one signal line formed on the first passivation layer PAS1. Also, the output signal lines OL1(n) to OL4(n) of the (n)th stage circuit ST(n) may be made of the same material on the same layer as the light blocking layer on the substrate 111.

The transparent display panel 110 according to another embodiment of the present disclosure may have substantially the same effect as that of the transparent display panel 110 described with reference to FIGS. 6 to 10, and the output signal lines of at least two stage circuits disposed in the cutting possible area may be disposed to overlap each other, thereby additionally making sure of a margin of the cutting possible area.

Figure 14:
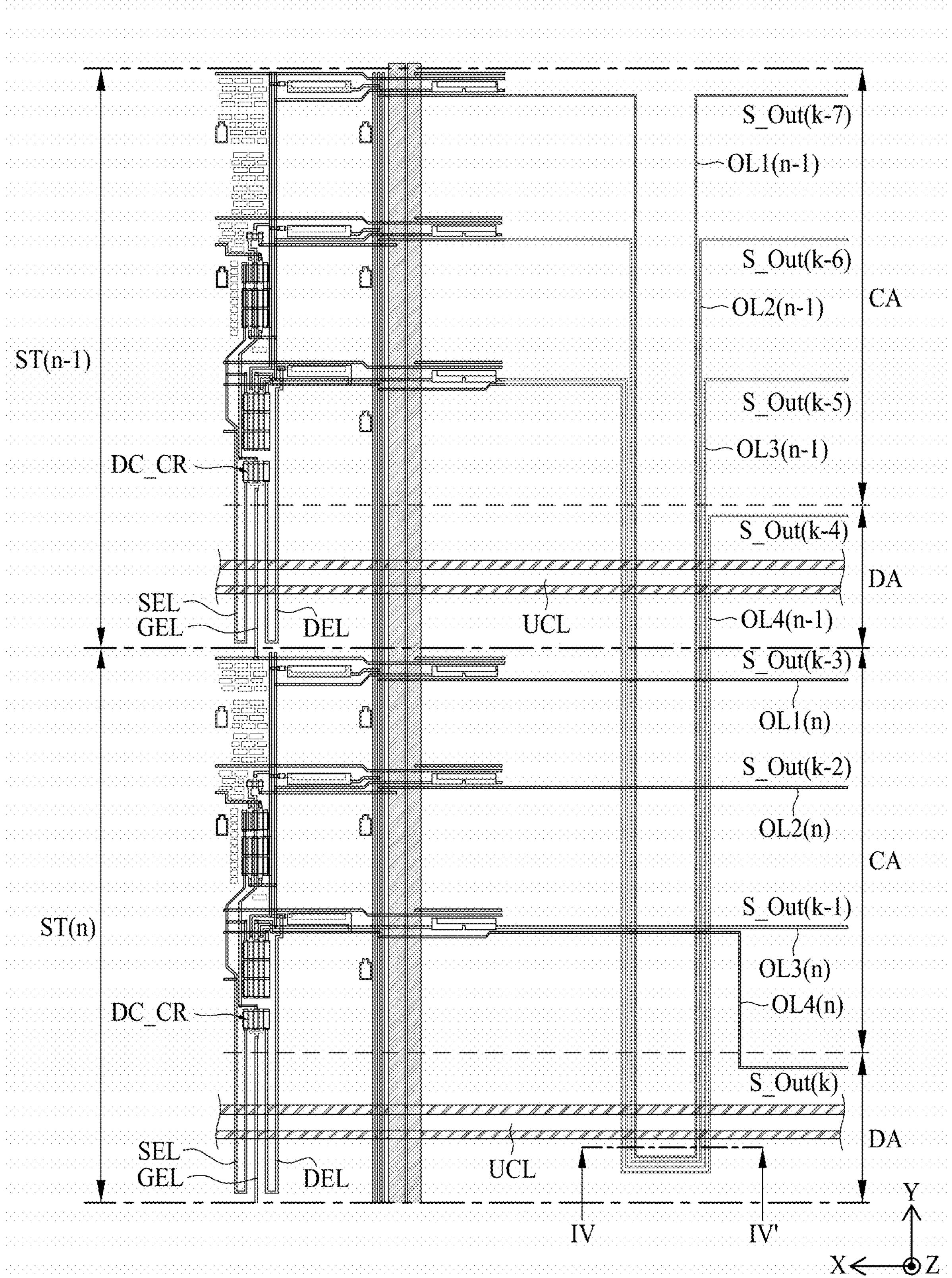
FIG. 14 is a view illustrating a layout of a stage circuit according to another embodiment of the present disclosure.
Figure 15:
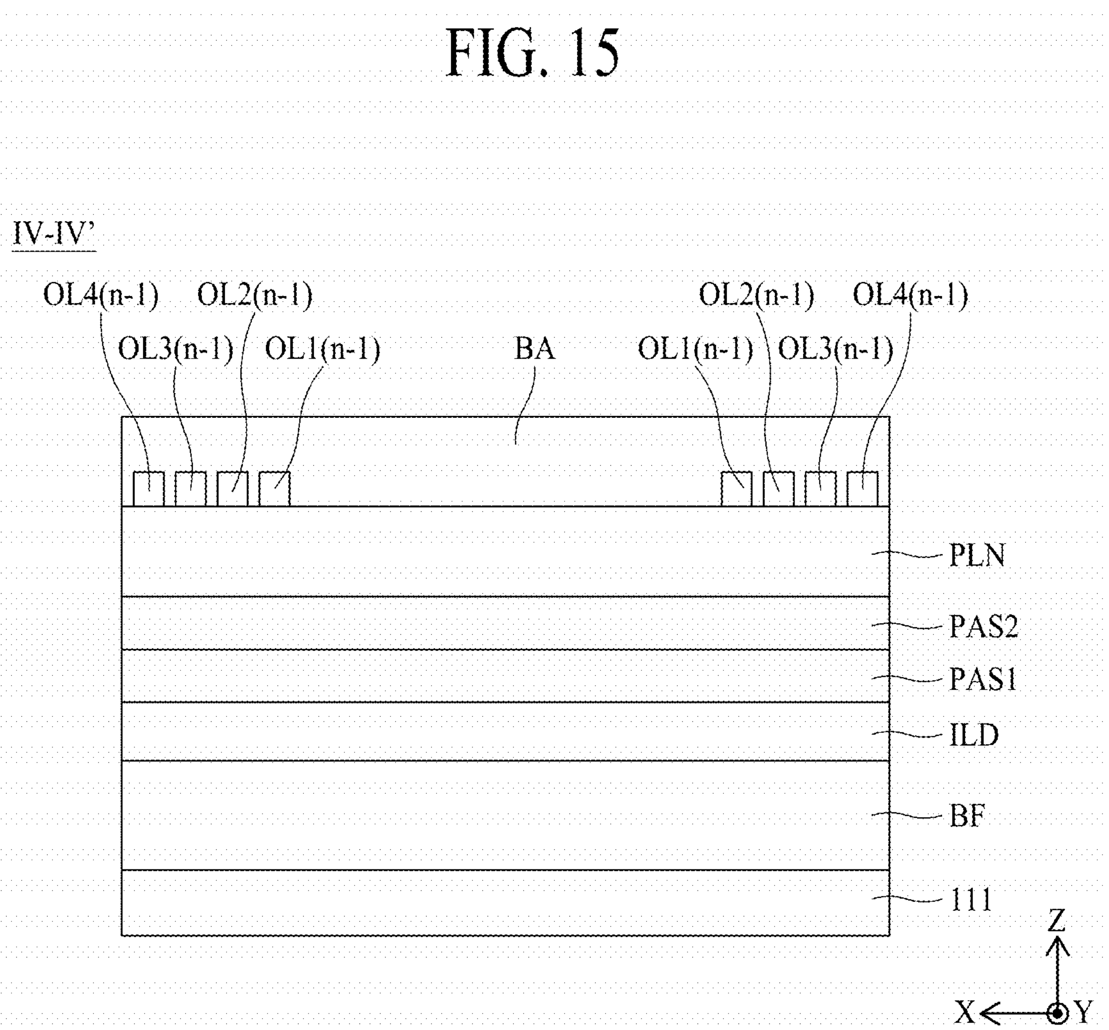
FIG. 15 is a cross-sectional view taken along line IV-IV' shown in FIG. 14 according to another embodiment of the present disclosure.
Figure 16:
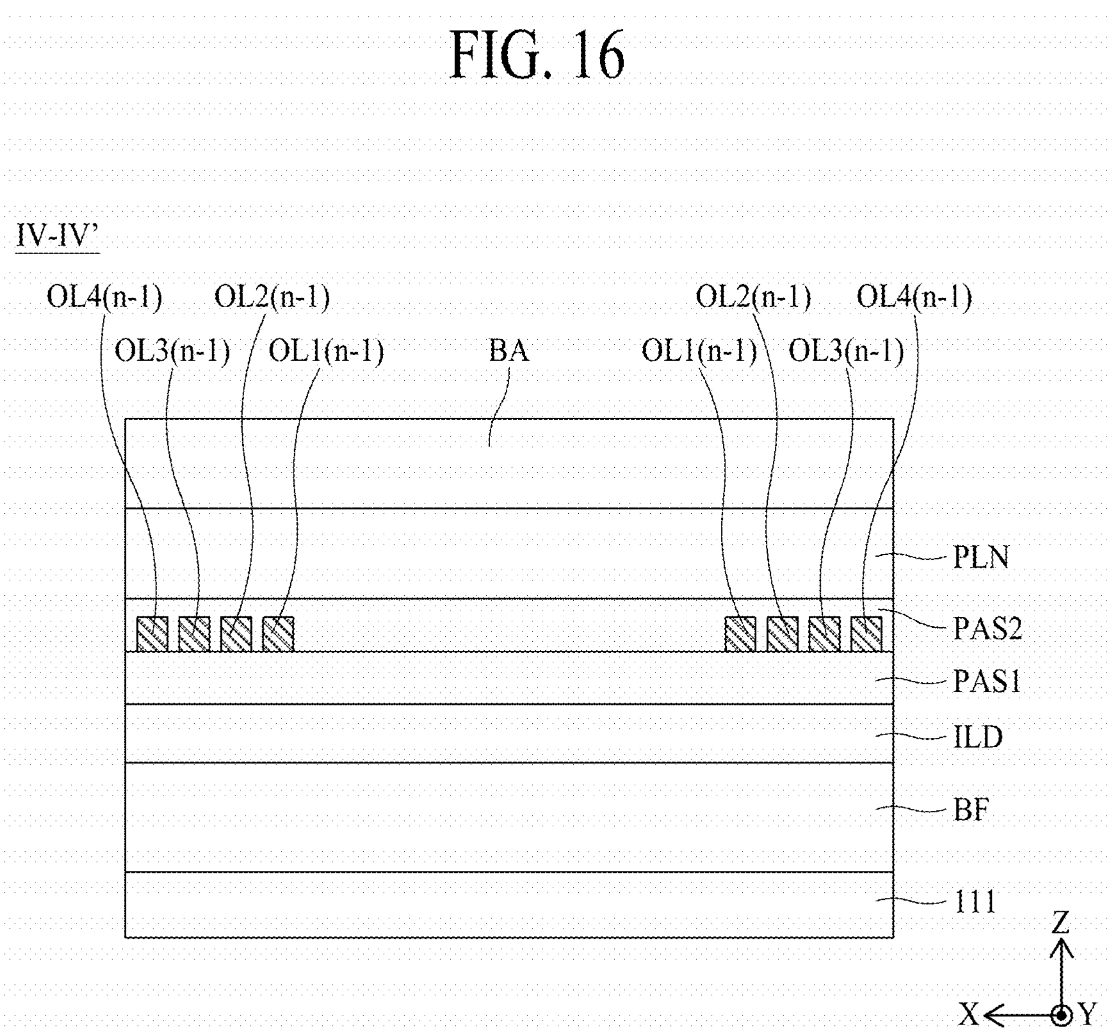
FIG. 16 is a cross-sectional view taken along line IV-IV' shown in FIG. 14 according to another embodiment of the present disclosure.

FIG. 14 is a view illustrating a layout of a stage circuit according to another embodiment of the present disclosure. FIG. 15 is a cross-sectional view taken along line IV-IV' shown in FIG. 14 according to another embodiment of the present disclosure. FIG. 16 is a cross-sectional view taken along line IV-IV' shown in FIG. 14 according to another embodiment of the present disclosure. In FIGS. 14 to 16, the elements of the output signal lines are modified in the transparent display panel 110 described with reference to FIGS. 6 to 13. In the following description, the same reference numerals will be given to the other same elements except for the modified elements, and their redundant description will be omitted or briefly described.

Referring to FIGS. 14 to 16, the transparent display panel 110 according to another embodiment of the present disclosure may include a plurality of stage circuits ST(n−1) and ST(n).

The output signal lines OL1(n−1) to OL4(n−1) of the (n−1)th stage circuit ST(n−1) and the output signal lines OL1(n) to OL4(n) of the (n)th stage circuit ST(n) may be configured to at least partially overlap each other on a plane. For example, the output signal lines OL1(n−1) to OL4(n−1) of the (n−1)th stage circuit ST(n−1) and the output signal lines OL1(n) to OL4(n) of the (n)th stage circuit ST(n) may be formed of different materials on different layers.

The output signal lines OL1(n−1) to OL4(n−1) of the (n−1)th stage circuit ST(n−1) may be extended in the second direction (or X-axis direction) from the circuit area CA of the (n−1)th stage circuit ST(n−1) and then may be bent in the first direction (or Y-axis direction) to extend to the dummy area DA of the (n)th stage circuit ST(n). The output signal lines OL1(n−1) to OL4(n−1) of the (n−1)th stage circuit ST(n−1) may be disposed to cross and overlap the output signal lines OL1(n) to OL4(n) of the (n)th stage circuit ST(n) in the circuit area CA of the (n)th stage circuit ST(n). The output signal lines OL1(n−1) to OL4(n−1) of the (n−1)th stage circuit ST(n−1) may be extended in the first direction (or Y-axis direction) by being bent at least twice in the dummy area DA of the (n)th stage circuit ST(n), and then may be extended to the pixel P of the display area AA by being bent in the second direction (or X-axis direction) in the circuit area CA of the (n−1)th stage circuit ST(n−1). Therefore, the output signal lines OL1(n−1) to OL4(n−1) of the (n−1)th stage circuit ST(n−1) may be configured to cross each of the undercut line UCL of the (n−1)th stage circuit ST(n−1) and the undercut line UCL of the (n)th stage circuit ST(n) at least twice. The output signal line of at least one of the (n−1)th stage circuit ST(n−1) and the (n)th stage circuit ST(n) may cross and overlap the undercut line UCL of the (n)th stage circuit ST(n). The portions or bent portion of the output signal lines OL1(n−1) to OL4(n−1) of the (n−1)th stage circuit ST(n−1), which are bent at least twice, may be disposed below the undercut line UCL of the (n)th stage circuit ST(n) in the dummy area DA of the (n)th stage circuit ST(n).

The output signal lines OL1(n) to OL4(n) of the (n)th stage circuit ST(n) may be extended in the second direction (or X-axis direction) from the circuit area CA of the (n)th stage circuit ST(n) and then may be connected to the pixel P of the display area AA. For example, among the output signal lines OL1(n) to OL4(n) of the (n)th stage circuit ST(n), the first output signal line OL1(n), the second output signal line OL2(n) and the third output signal line OL3(n) may be extended in the second direction (or X-axis direction) and then connected to the pixel P of the display area AA, and the fourth output signal line OL4(n) may have a portion bent at least once in the circuit area CA of the (n)th stage circuit ST(n) and may be extended in the second direction (or X-axis direction) and connected to the pixel P of the display area AA. At least a portion of the output signal lines OL1(n) to OL4(n) of the (n)th stage circuit ST(n) may cross and overlap the output signal lines OL1(n−1) to OL4(n−1) of the (n−1)th stage circuit ST(n−1). The output signal lines OL1(n) to OL4(n) of the (n)th stage circuit ST(n) may not be disposed in the dummy area DA.

Referring to FIG. 15, in the dummy area DA of the (n)th stage circuit ST(n), the output signal lines OL1(*n*−1) to OL4(*n*−1) of the (n−1)th stage circuit ST(n−1) may be disposed and the output signal lines OL1(*n*) to OL4(*n*) of the (n)th stage circuit ST(n) may not be disposed. The output signal lines OL1(*n*−1) to OL4(*n*−1) of the (n−1)th stage circuit ST(n−1) may be made of the same material on the same layer as the first electrode (or the pixel electrode or the anode electrode) of the light emitting element disposed in the planarization layer PLN.

Referring to FIG. 16, the output signal lines OL1(*n*−1) to OL4(*n*−1) of the (n−1)th stage circuit ST(n−1) may be disposed between the first passivation layer PAS1 and the second passivation layer PAS2. For example, the output signal lines OL1(*n*−1) to OL4(*n*−1) of the (n−1)th stage circuit ST(n−1) may be made of the same material as that of at least one signal line formed on the first passivation layer PAS1.

In the transparent display panel 110 according to another embodiment of the present disclosure, when the dummy area DA of the (n th stage circuit ST(n) is cut (separated), a global reset signal is applied to the (n−1)th stage circuit ST(n−1) and the (n)th stage circuit ST(n), and the (n−1)th stage circuit ST(n−1) and the (n)th stage circuit ST(n) may be configured as dummy stage circuits by separating or disconnecting the output signal lines OL1(*n*−1) to OL4(*n*−1) of the (n−1)th stage circuit ST(n−1). For example, the first dummy stage circuit ST(n−1) may be configured so that the first to fourth output signals S_Out(k−7) to S_Out(k−4) may not be output by separating or disconnecting the output signal lines OL1(*n*−1) to OL4(*n*−1) of the (n−1)th stage circuit ST(n−1), and the second dummy stage circuit ST(n) may be configured so that the first to fourth output signals S_Out(k−3) to S_Out(k) may not be output by applying the global reset signal. For example, after the fourth output signal S_Out (k−8) of the (n−2)th stage circuit ST(n−2), which is the previous stage of the first dummy stage circuit ST(n−1), is output, the second dummy stage circuit ST(n) may not output the first to fourth output signals S_Out(k−3) to S_Out(k) by applying the global reset signal.

The transparent display panel 110 according to another embodiment of the present disclosure may have substantially the same effect as that of the transparent display panel 110 described with reference to FIGS. 6 to 13, and the output signal lines of one of the two dummy stage circuits may be disposed in in the cutting possible area, thereby additionally making sure of a margin of the cutting possible area.

Figure 17:
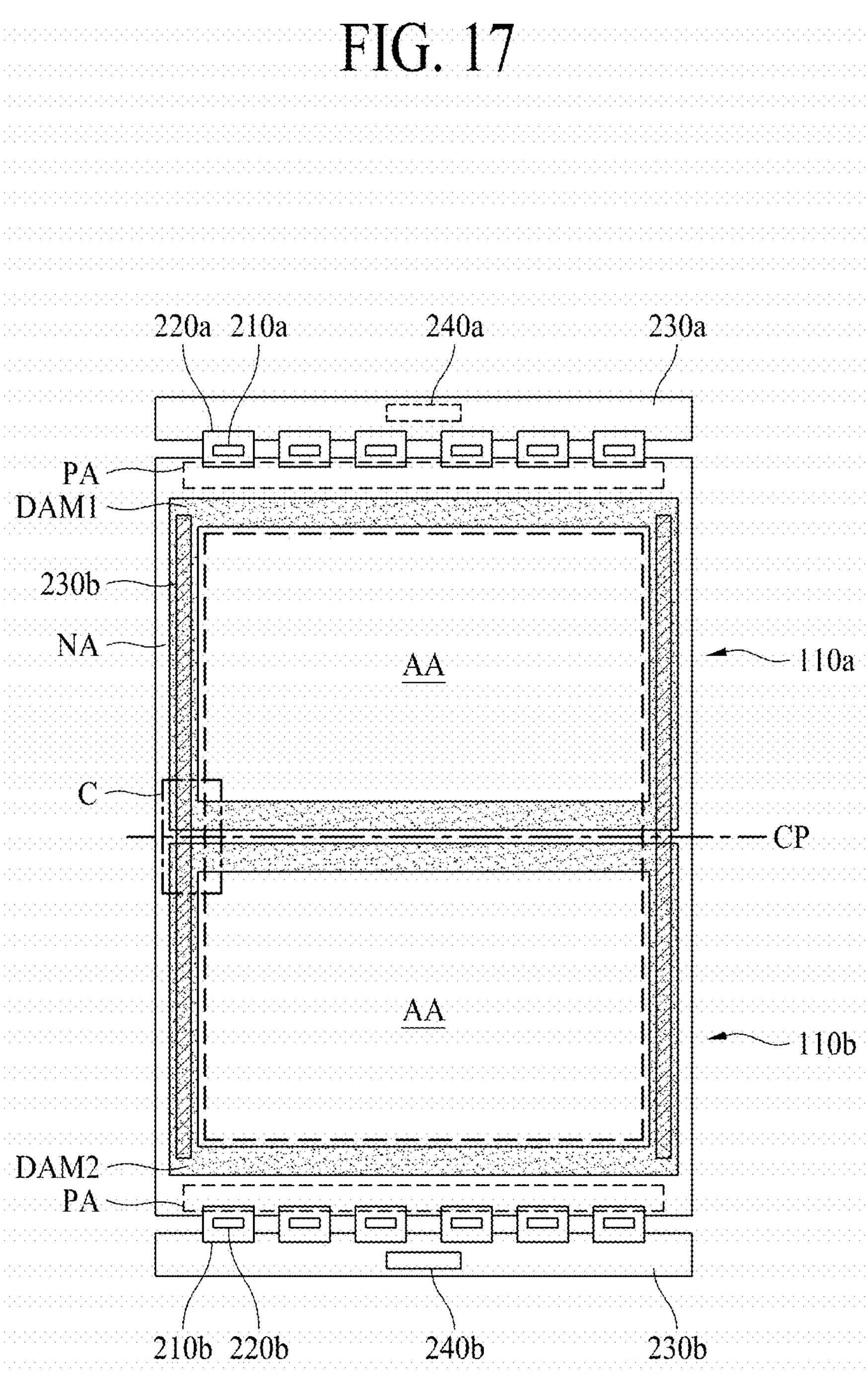
FIG. 17 is a cross-sectional view illustrating a transparent display apparatus according to another embodiment of the present disclosure.

FIG. 17 is a cross-sectional view illustrating a transparent display apparatus according to another embodiment of the present disclosure.

Referring to FIG. 17, the transparent display panel 110 according to another embodiment of the present disclosure may include a display area AA in which pixels are configured to display an image and a non-display area NA in which an image is not displayed.

The transparent display panel 110 according to another embodiment of the present disclosure may include at least one undercut line UCL extended from the non-display area NA to the display area AA in the second direction (or X-axis direction).

The transparent display panel 110 may include dam patterns DAM1 and DAM2 that divide the display area AA into at least two or more. The dam patterns DAM1 and DAM2 may be configured in the form of a closed loop surrounding at least a portion of the non-display area NA (or bezel area) and the display area AA so that the display area AA may be divided into at least two or more. For example, the dam patterns DAM1 and DAM2 may include a first dam pattern DAM1 and a second dam pattern DAM2.

The first dam pattern DAM1 may be configured to surround the display area AA positioned at an upper side in the first direction (or Y-axis direction). The second dam pattern DAM2 may be configured to surround the display area AA positioned at a lower side in the first direction (or Y-axis direction).

The first dam pattern DAM1 and the second dam pattern DAM2 may be spaced apart from each other in the first direction (or Y-axis direction). Alternatively, the first dam pattern DAM1 and the second dam pattern DAM2 may be disposed such that at least portions adjacent to each other overlap each other.

The transparent display panel 110 may include first and second source drive integrated circuits (hereinafter, referred to as "IC") 210*a* and 210*b*, first and second flexible films 220*a* and 220*b*, first and second circuit boards 230*a* and 230*b*, and first and second timing controllers 240*a* and 240*b*.

The first source drive IC 210*a*, the first flexible film 220*a*, the first circuit board 230*a* and the first timing controller 240*a* may be connected to the upper display area AA defined by the first dam pattern DAM1, and the second source drive IC 210*b*, the second flexible film 220*b*, the second circuit board 230*b* and the second timing controller 240*b* may be connected to the lower display area AA defined by the second dam pattern DAM2.

A cutting portion CP may be provided between the first dam pattern DAM1 and the second dam pattern DAM2. The cutting portion CP is a portion in which the transparent display panel 110 may be separated or cut through a cutting device such as a laser or a wheel. For example, the display areas AA surrounded by the first and second dam patterns DAM1 and DAM2 may become display areas AA of the transparent display panels 110*a* and 110*b* independent of each other by being separated or cut by the cutting portion CP.

The first and second dam patterns DAM1 and DAM2 may be non-display areas NA (or bezel areas) of the separated transparent display panels 110*a* and 110*b*, respectively. For example, a center portion of the display area AA in which the first and second dam patterns DAM1 and DAM2 cross in the second direction (or X-axis direction) is the display area AA before cutting, but may be the non-display area NA (or bezel area) after cutting.

Figure 18:
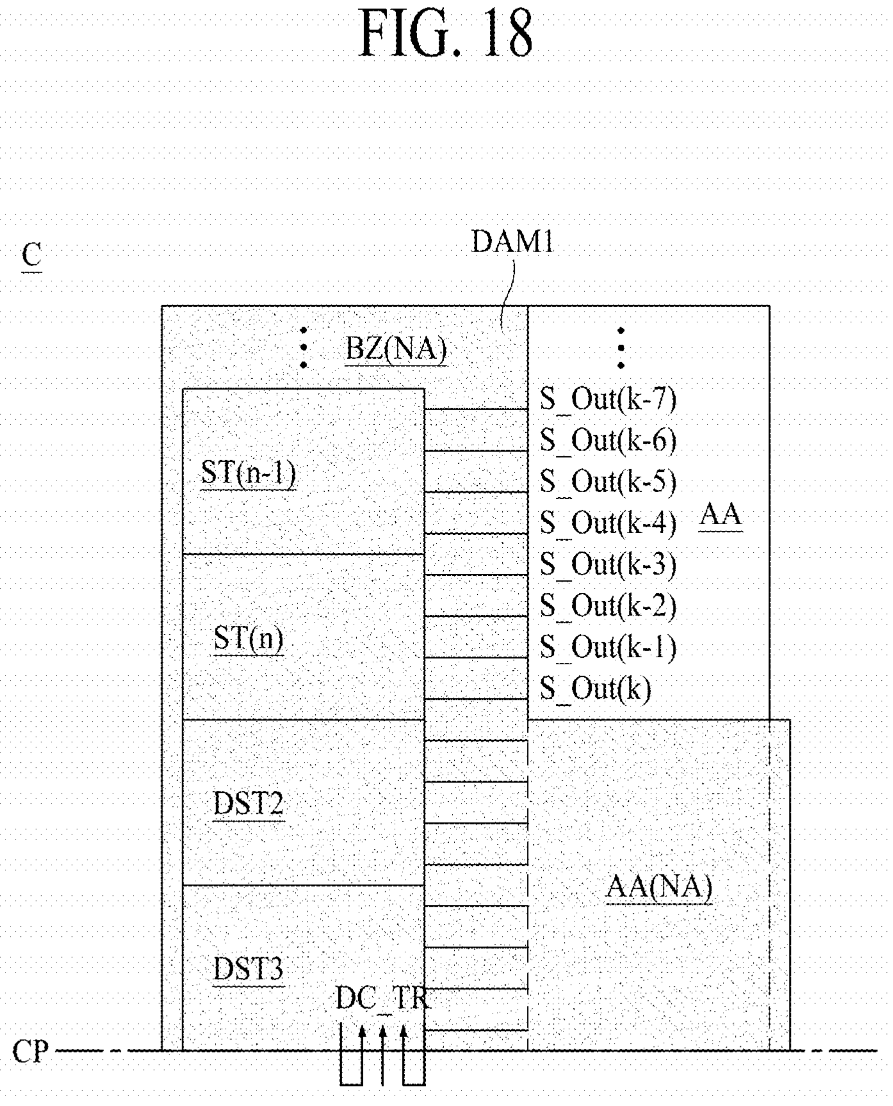
FIG. 18 is a view illustrating an area C shown in FIG. 17 according to another embodiment of the present disclosure.

FIG. 18 is a view illustrating an area C shown in FIG. 17 according to another embodiment of the present disclosure.

Referring to FIG. 18, the first dam pattern DAM1 may be disposed to surround a portion of the display area AA and the bezel area BZ in which a plurality of stage circuits ST(n−1), ST(n), DST2 and DST3 are disposed. A portion surrounded by the first dam pattern DAM1 may be the non-display area NA. For example, the display area AA surrounded by the first dam pattern DAM1 may be the non-display area NA (see AA (NA) in FIG. 18).

The plurality of stage circuits ST(n−1), ST(n), DST2 and DST3 may be disposed in parallel with the pixels P disposed in the display area AA or in parallel with the display area AA in the second direction (or X-axis direction). The plurality of stage circuits ST(n−1), ST(n), DST2 and DST3 may include at least two dummy stage circuits DST2 and DST3 adjacent to the cutting portion CP outside the first dam pattern DAM1. In the dummy stage circuit DST3, which is adjacent to the cutting portion CP, of the dummy stage circuits DST2 and DST3, at least one signal line of the discharge transistor DC_TR may be cut (or separated) together with cutting of the cutting portion CP. In the dummy stage circuit DST3, the discharge transistor DC_TR may be electrically removed (or separated) by separating or disconnecting at least one signal line of the discharge transistor DC_TR. Therefore, an abnormal operation of the dummy stage circuit due to a floating phenomenon of the discharge transistor DC_TR may be prevented.

Figure 19:
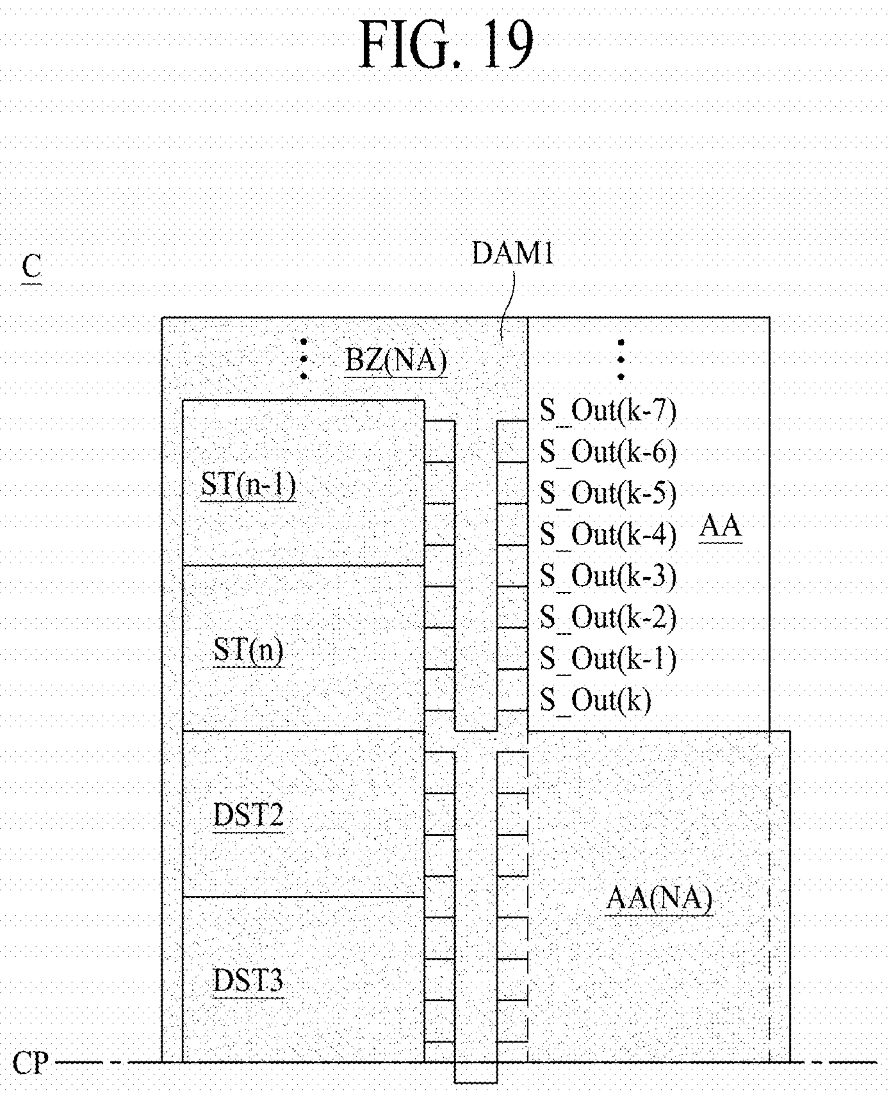
FIG. 19 is another view illustrating an area C shown in FIG. 17 according to another embodiment of the present disclosure.

FIG. 19 is another view illustrating an area C shown in FIG. 17 according to another embodiment of the present disclosure.

Referring to FIG. 19, the plurality of stage circuits ST(n−1), ST(n), DST2 and DST3 may include at least two dummy stage circuits DST2 and DST3 adjacent to the cutting portion CP outside the first dam pattern DAM1.

In the two dummy stage circuits DST2 and DST3, a plurality of output signal lines may be cut (or separated) together with cutting of the cutting portion CP. The two dummy stage circuits DST2 and DST3 may be configured so that the output signals may not be output by separating or disconnecting the output signal lines. Therefore, the two dummy stage circuits DST2 and DST3 may prevent the light emitting element disposed in the non-display area NA surrounded by the first dam pattern DAM1 from being abnormally lighted (or from abnormally emitting light).

Figure 20:
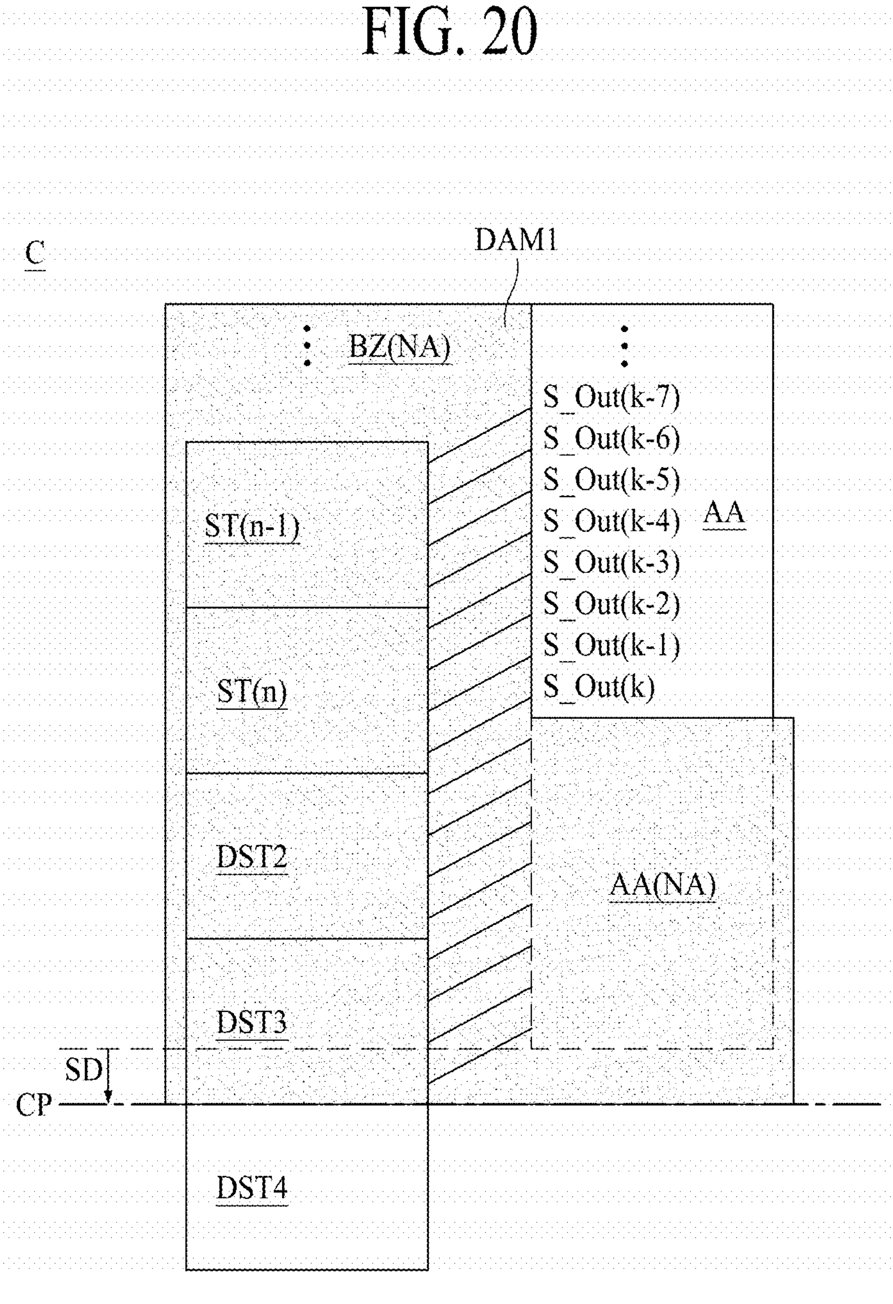
FIG. 20 is another view illustrating an area C shown in FIG. 17 according to another embodiment of the present disclosure.

FIG. 20 is another view illustrating an area C shown in FIG. 17 according to another embodiment of the present disclosure.

Referring to FIG. 20, a plurality of stage circuits ST(n−1), ST(n), DST2, DST3 and DST4 may be shifted in the first direction (or Y-axis direction) to be misaligned with the pixel P disposed in the display area AA or to be misaligned with the display area AA in the second direction. The plurality of stage circuits ST(n−1), ST(n), DST2, DST3 and DST4 may be configured to be more protruded downwardly than the display area AA in the first direction (or Y-axis direction). For example, the plurality of stage circuits ST(n−1), ST(n), DST2, DST3 and DST4 may be configured to be more protruded at a predetermined interval SD than the display area AA surrounded by the first dam pattern DAM1. For example, the predetermined interval SD may be changed depending on a cutting process margin of the cutting portion CP.

A gate driving circuit and the transparent display apparatus comprising the same according to one or more embodiments of the present disclosure will be described below.

A gate driving circuit according to one or more embodiments of the present disclosure may include a plurality of stage circuits connected to be cascaded to each other along a first direction, outputting a plurality of output signals, each stage circuit of the plurality of stage circuits may include a circuit area in which a circuit portion including at least one thin film transistor for controlling the output of the plurality of output signals is disposed, and a dummy area in which an undercut line extended in a second direction transverse to the first direction is disposed.

According to one or more embodiments of the present disclosure, the dummy area may be disposed at a lowermost end of the each stage circuit.

According to one or more embodiments of the present disclosure, the circuit portion may include a discharge transistor controlling charging and discharging of a Q node voltage controlling the plurality of output signals, and the discharge transistor may be disposed to be adjacent to the dummy area.

According to one or more embodiments of the present disclosure, at least a portion of a signal line of the discharge transistor may be disposed in the dummy area.

According to one or more embodiments of the present disclosure, at least a portion of the signal line of the discharge transistor may cross and overlap the undercut line.

According to one or more embodiments of the present disclosure, the signal line of the discharge transistor may be bent at least twice to cross the undercut line at least twice.

According to one or more embodiments of the present disclosure, the bent portion of the signal line of the discharge transistor may be disposed below the undercut line in the first direction.

According to one or more embodiments of the present disclosure, the gate driving circuit may further comprise a block pattern disposed at a portion where the signal line of the discharge transistor and the undercut line cross each other, wherein the block pattern may be disposed in at least one insulating layer between the signal line of the discharge transistor and the undercut line.

According to one or more embodiments of the present disclosure, the signal line of the discharge transistor may be independently branched from a signal line of another thin film transistor of the circuit portion.

According to one or more embodiments of the present disclosure, the plurality of stage circuits may include at least one dummy stage circuit, and the at least one dummy stage circuit may be configured by removing the discharge transistor.

According to one or more embodiments of the present disclosure, the at least one dummy stage circuit may be configured by separating or disconnecting the signal line of the discharge transistor disposed in the dummy area.

According to one or more embodiments of the present disclosure, the plurality of stage circuits may include a first stage circuit, and a second stage circuit disposed at a lower end of the first stage circuit in the first direction, and the dummy area of the second stage circuit may be shared with the first stage circuit.

According to one or more embodiments of the present disclosure, an output signal line of at least one of the first stage circuit and the second stage circuit may be disposed in the dummy area of the second stage circuit.

According to one or more embodiments of the present disclosure, the output signal line of at least one of the first stage circuit and the second stage circuit may cross and overlap the undercut line of the second stage circuit.

According to one or more embodiments of the present disclosure, the output signal line of at least one of the first stage circuit and the second stage circuit may be bent at least twice to cross the undercut line of the second stage circuit at least twice.

According to one or more embodiments of the present disclosure, the bent portion of the output signal line of at least one of the first stage circuit and the second stage circuit may be disposed below the undercut line of the second stage circuit in the first direction.

According to one or more embodiments of the present disclosure, a plurality of output signal lines of the first stage circuit and a plurality of output signal lines of the second stage circuit may be either made of a same material on a same layer on a substrate, or may be made of different materials on different layers on the substrate.

According to one or more embodiments of the present disclosure, the plurality of output signal lines of the first stage circuit and the plurality of output signal lines of the second stage circuit may overlap each other in the dummy area of the second stage circuit.

According to one or more embodiments of the present disclosure, the plurality of output signal lines of the first stage circuit may be disposed in the dummy area of the second stage circuit, and the plurality of output signal lines of the second stage circuit may be extended in the second direction.

According to one or more embodiments of the present disclosure, the plurality of output signal lines of the first stage circuit may cross and overlap the plurality of output signal lines of the second stage circuit.

According to one or more embodiments of the present disclosure, the first stage circuit may include a first dummy stage circuit, the second stage circuit may include a second dummy stage circuit, and each of the first dummy stage circuit and the second dummy stage circuit may be configured so that an output signal is not output.

According to one or more embodiments of the present disclosure, the first dummy stage circuit and the second dummy stage circuit may be configured by either separating or disconnecting at least one output signal line disposed in the dummy area of the second dummy stage circuit.

According to one or more embodiments of the present disclosure, at least one of the first dummy stage circuit and the second dummy stage circuit may be configured so that an output signal is not output by the control of a global reset signal applied thereto.

According to one or more embodiments of the present disclosure, the second dummy stage circuit is a circuit from which the discharge transistor controlling charging and discharging of a Q node voltage controlling the output signal is removed.

According to one or more embodiments of the present disclosure, may further include a light blocking layer, the light blocking layer may be formed of a same material on a same layer as at least a portion of the signal line of the discharge transistor.

According to one or more embodiments of the present disclosure, may further include a buffer layer, the buffer layer may be disposed on a substrate on which the at least a portion of the signal line of the discharge transistor and the light blocking layer are disposed.

According to one or more embodiments of the present disclosure, the block pattern may be disposed on a first passivation layer on which a second passivation layer is disposed, and a planarization layer is disposed on the second passivation layer, and the undercut line may include a support line and an cave line disposed on the support line and protruded from the support line.

According to one or more embodiments of the present disclosure, the support line may include at least one insulating layer between the second passivation layer or the planarization layer and a substrate, and the cave line includes the planarization layer.

According to one or more embodiments of the present disclosure, the output signal line of the first stage circuit may cross each of the undercut line of the first stage circuit and the undercut line of the second stage circuit at least twice.

According to one or more embodiments of the present disclosure, the gate driving circuit may further comprise a substrate including a display area for displaying an image, wherein the plurality of stage circuits may be disposed in parallel with the display area on the substrate in the second direction.

According to one or more embodiments of the present disclosure, the gate driving circuit may further comprise a substrate including a display area for displaying an image, wherein the plurality of stage circuits may be shifted in the first direction on the substrate and disposed to be misaligned with the display area in the second direction.

A transparent display apparatus according to one or more embodiments of the present disclosure may include a display panel including a display area and a non-display area around the display area, the display panel including a transmissive area and a non-transmissive area, and a gate driving circuit disposed in the non-display area of the display panel, wherein the gate driving circuit includes a plurality of stage circuits connected to be cascaded to each other along a first direction, outputting a plurality of output signals, wherein each of the stage circuits may include a circuit area in which a circuit portion including at least one thin film transistor for controlling the output of the plurality of output signals is disposed, and a dummy area in which an undercut line extended in a second direction crossing the first direction is disposed, and the undercut line disposed in the dummy area of each of the plurality of stage circuits may be extended to the display area and the non-display area of the display panel.

According to one or more embodiments of the present disclosure, the undercut line may be configured to cross the non-display area and the display area in the second direction.

According to one or more embodiments of the present disclosure, the display panel may further include a dam pattern surrounding the non-display area from a plan view.

According to one or more embodiments of the present disclosure, at least a portion of the dam pattern may be disposed in parallel with the undercut line.

According to one or more embodiments of the present disclosure, the plurality of stage circuits may be disposed in parallel with the display area in the second direction.

According to one or more embodiments of the present disclosure, the plurality of stage circuits may be shifted in the first direction and disposed to be misaligned with the display area in the second direction.

It will be apparent to those skilled in the art that various modifications and variations may be made in the apparatus of the present disclosure without departing from the scope of the disclosure. Thus, it is intended that the present disclosure cover the modifications and variations of this disclosure provided that within the scope of the claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate driving circuit comprising:

a plurality of stage circuits connected to be cascaded to each other along a first direction, outputting a plurality of output signals, wherein each stage circuit of the plurality of stage circuits includes:

a circuit area in which a circuit portion including at least one thin film transistor for controlling the output of the plurality of output signals is disposed; and a dummy area in which an undercut line extended in a second direction transverse to the first direction is disposed, wherein the circuit portion includes a discharge transistor controlling charging and discharging of a Q node voltage controlling the plurality of output signals, wherein the discharge transistor is disposed to be adjacent to the dummy area, and wherein at least a portion of a signal line of the discharge transistor is disposed in the dummy area.

2. The gate driving circuit of claim 1, wherein the dummy area is disposed at a lowermost end of the each stage circuit.

3. The gate driving circuit of claim 1, wherein at least a portion of the signal line of the discharge transistor crosses and overlaps the undercut line.

4. The gate driving circuit of claim 3, wherein the signal line of the discharge transistor is bent at least twice to cross the undercut line at least twice.

5. The gate driving circuit of claim 4, wherein the bent portion of the signal line of the discharge transistor is disposed below the undercut line in the first direction.

6. The gate driving circuit of claim 3, further comprising a block pattern disposed at a portion where the signal line of the discharge transistor and the undercut line cross each other, wherein the block pattern is disposed in at least one insulating layer between the signal line of the discharge transistor and the undercut line.

7. The gate driving circuit of claim 6, wherein the block pattern is disposed on a first passivation layer on which a second passivation layer is disposed, and a planarization layer is disposed on the second passivation layer, and wherein the undercut line includes a support line and an eave line disposed on the support line and protruded from the support line.

8. The gate driving circuit of claim 7, wherein the support line includes at least one insulating layer between the second passivation layer or the planarization layer and a substrate, and the eave line includes the planarization layer.

9. The gate driving circuit of claim 1, wherein the signal line of the discharge transistor is independently branched from a signal line of another thin film transistor of the circuit portion.

10. The gate driving circuit of claim 1, wherein the plurality of stage circuits includes at least one dummy stage circuit, and wherein the at least one dummy stage circuit is configured by removing the discharge transistor.

11. The gate driving circuit of claim 10, wherein the at least one dummy stage circuit is configured by separating or disconnecting the signal line of the discharge transistor disposed in the dummy area.

12. The gate driving circuit of claim 1, wherein the plurality of stage circuits includes a first stage circuit, and a second stage circuit disposed at a lower end of the first stage circuit in the first direction, and wherein the dummy area of the second stage circuit is shared with the first stage circuit.

13. The gate driving circuit of claim 12, wherein an output signal line of at least one of the first stage circuit and the second stage circuit is disposed in the dummy area of the second stage circuit.

14. The gate driving circuit of claim 13, wherein the output signal line of at least one of the first stage circuit and the second stage circuit crosses and overlaps the undercut line of the second stage circuit.

15. The gate driving circuit of claim 14, wherein the output signal line of at least one of the first stage circuit and the second stage circuit is bent at least twice to cross the undercut line of the second stage circuit at least twice.

16. The gate driving circuit of claim 15, wherein the bent portion of the output signal line of at least one of the first stage circuit and the second stage circuit is disposed below the undercut line of the second stage circuit in the first direction.

17. The gate driving circuit of claim 14, wherein the output signal line of the first stage circuit crosses each of the undercut line of the first stage circuit and the undercut line of the second stage circuit at least twice.

18. The gate driving circuit of claim 12, wherein a plurality of output signal lines of the first stage circuit and a plurality of output signal lines of the second stage circuit either are made of a same material on a same layer on a substrate, or are made of different materials on different layers on the substrate.

19. The gate driving circuit of claim 12, wherein a plurality of output signal lines of the first stage circuit and a plurality of output signal lines of the second stage circuit overlap each other in the dummy area of the second stage circuit.

20. The gate driving circuit of claim 12, wherein a plurality of output signal lines of the first stage circuit are disposed in the dummy area of the second stage circuit, and wherein a plurality of output signal lines of the second stage circuit are extended in the second direction.

21. The gate driving circuit of claim 20, wherein the plurality of output signal lines of the first stage circuit cross and overlap the plurality of output signal lines of the second stage circuit.

22. The gate driving circuit of claim 12, wherein the first stage circuit includes a first dummy stage circuit, wherein the second stage circuit includes a second dummy stage circuit, and wherein each of the first dummy stage circuit and the second dummy stage circuit is configured so that an output signal is not output.

23. The gate driving circuit of claim 22, wherein the first dummy stage circuit and the second dummy stage circuit are configured by either separating or disconnecting at least one output signal line disposed in the dummy area of the second dummy stage circuit.

24. The gate driving circuit of claim 22, wherein at least one of the first dummy stage circuit and the second dummy stage circuit is configured so that an output signal is not output by the control of a global reset signal applied thereto.

25. The gate driving circuit of claim 22, wherein the second dummy stage circuit is a circuit from which a discharge transistor controlling charging and discharging of a Q node voltage controlling the output signal is removed.

26. The gate driving circuit of claim 1, further comprising a light blocking layer, wherein the light blocking layer is formed of a same material on a same layer as at least a portion of the signal line of the discharge transistor.

27. The gate driving circuit of claim 26, further comprising a buffer layer, wherein the buffer layer is disposed on a substrate on which the at least a portion of the signal line of the discharge transistor and the light blocking layer are disposed.

28. The gate driving circuit of claim 1, further comprising a substrate including a display area for displaying an image, wherein the plurality of stage circuits is disposed in parallel with the display area on the substrate in the second direction.

29. The gate driving circuit of claim 1, further comprising a substrate including a display area for displaying an image, wherein the plurality of stage circuits is shifted in the first direction on the substrate and disposed to be misaligned with the display area in the second direction.

30. A transparent display apparatus comprising:

a display panel including a display area and a non-display area around the display area, the display area including a transmissive area and a non-transmissive area; and a gate driving circuit disposed in the non-display area of the display panel, wherein the gate driving circuit includes a plurality of stage circuits of the gate driving circuit of claim 1, and wherein an undercut line disposed in the dummy area of each of the plurality of stage circuits is extended to the display area and the non-display area of the display panel.

31. The transparent display apparatus of claim 30, wherein the undercut line is configured to cross the non-display area and the display area in the second direction.

32. The transparent display apparatus of claim 30, wherein the display panel further includes a dam pattern surrounding the non-display area from a plan view.

33. The transparent display apparatus of claim 32, wherein at least a portion of the dam pattern is disposed in parallel with the undercut line.

34. The transparent display apparatus of claim 30, wherein the plurality of stage circuits is disposed in parallel with the display area in the second direction.

35. The transparent display apparatus of claim 30, wherein the plurality of stage circuits is shifted in the first direction and disposed to be misaligned with the display area in the second direction.

* * * * *